(12) United States Patent
Van Wijmeersch

(10) Patent No.: US 8,247,839 B2
(45) Date of Patent: Aug. 21, 2012

(54) ESD PROTECTION DEVICE WITH INCREASED HOLDING VOLTAGE DURING NORMAL OPERATION

(75) Inventor: Sven Van Wijmeersch, Brakel (BE)

(73) Assignee: Sofics BVBA, Gistel (BE)

( * ) Notice: Subject to any disclaimer, the term of this patent is extended or adjusted under 35 U.S.C. 154(b) by 465 days.

(21) Appl. No.: 12/500,170

(22) Filed: Jul. 9, 2009

(65) Prior Publication Data

US 2010/0006890 A1    Jan. 14, 2010

Related U.S. Application Data

(60) Provisional application No. 61/079,219, filed on Jul. 9, 2008.

(51) Int. Cl.
*H01L 29/74* (2006.01)
(52) U.S. Cl. .................. 257/107; 257/E29.181
(58) Field of Classification Search .............. 257/107, 257/140, 918, E29.181; 438/133
See application file for complete search history.

(56) References Cited

U.S. PATENT DOCUMENTS

| | | | |
|---|---|---|---|
| 4,937,647 A * | 6/1990 | Sutton | 257/378 |
| 5,493,133 A | 2/1996 | Duvvury et al. | |
| 6,147,369 A | 11/2000 | Chen et al. | |
| 6,281,527 B1 | 8/2001 | Chen | |
| 6,433,368 B1 | 8/2002 | Vashchenko et al. | |
| 6,570,226 B1 | 5/2003 | Groeseneken et al. | |
| 6,720,624 B1 | 4/2004 | Vashchenko et al. | |
| 6,768,616 B2 | 7/2004 | Mergens et al. | |
| 6,803,633 B2 | 10/2004 | Mergens et al. | |
| 7,123,054 B2 | 10/2006 | Satou et al. | |
| 2004/0100745 A1 | 5/2004 | Chen et al. | |
| 2009/0244797 A1 | 10/2009 | Sawahata | |

OTHER PUBLICATIONS

Zi-Ping Chen et al., "Dynamic Holding Voltage SCR (DHVSCR) Device for ESD Protection with High Latch-Up Immunity," ESD Protection Technology Department, System-on-Chip Technology Center Industrial Technology Research Institute, Hsinchu, Taiwan (2003).

* cited by examiner

Primary Examiner — Quoc Hoang
(74) Attorney, Agent, or Firm — Volpe and Koenig, P.C.

(57) ABSTRACT

An ESD protection circuit including an SCR having at least one PNP transistor and at least one NPN transistor such that at least one of the PNP transistor and the NPN transistor having an additional second collector. The circuit further including at least one control circuit coupled to the at least one second collector to control holding voltage of the SCR.

24 Claims, 22 Drawing Sheets

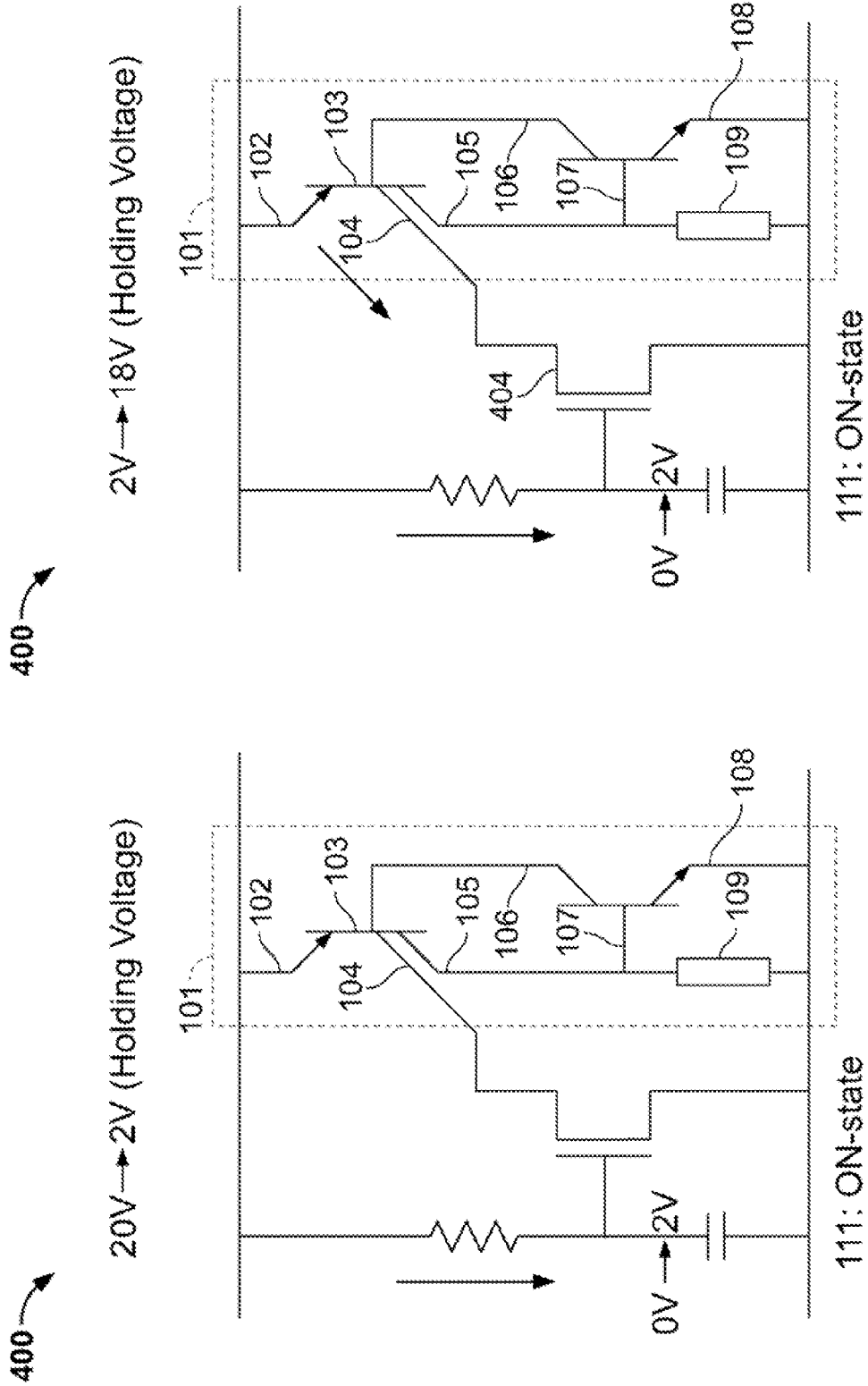

ESD PROTECTION DEVICE WITH INCREASED HOLDING VOLTAGE DURING NORMAL OPERATION

CROSS REFERENCES

This patent application claims the benefit of U.S. Provisional Application Ser. No. 61/079,219 filed Jul. 9, 2008, the contents of which are incorporated by reference herein.

FIELD OF THE INVENTION

The present invention generally relates to circuits that provide improved elecrostatic discharge (ESD) protection, and more particularly to method and apparatus for providing an improved ESD protection device with increased trigger/holding voltage during normal operation.

BACKGROUND OF THE INVENTION

As ESD protection, snapback-based solutions need to have a trigger voltage that is higher than the supply voltage of the chip they are protecting. However, in some applications, noise spikes and system level events are a common occurrence. If the difference between the chip's supply voltage and the snapback-based solution's trigger voltage is not high enough, these events can trigger the ESD protection. If the snapback voltage, and thus the holding voltage, is below the supply voltage, latch-up can occur.

Some of the current solutions include increasing the holding voltage such that certain elements are placed in series with the ESD protection. All current going the ESD protection must also run through these elements, which causes an extra voltage drop over them. This also means that to maintain the protection structure's holding current, a voltage is needed over these series elements. This effectively increases the holding voltage. A number of elements can be placed in series to the holding voltage above the supply voltage. The downside of this technique is that as you are dealing with relatively higher supply voltages and more series elements are needed. This means increased area consumption and increase in voltage does not always scale well with the number of devices for larger numbers (due to e.g. the parasitic SCR when using holding diodes). For high voltage technologies where snapback devices have very low holding voltages w.r.t. the supply voltage, this approach becomes very difficult. An example of this approach can be found in U.S. Pat. No. 6,768,616.

Another solution is to increase the trigger current via the feedback mechanism of the snapback device. This is hindered by adding low resistive leakage paths for the feedback current. For an SCR this is accomplished by connecting low value resistors to one or both gates. It is then more difficult for the feedback current to build up a voltage over the base-emitter junction of the bipolar transistor or transistors. This in turn results in lower additions to the feedback current. This technique can effectively prevent snapback devices from triggering in events where the current content is limited in some way (e.g. noise spikes). For events with a high current content however, the devices will trigger when the trigger voltage is reached, leading to snapback. Again, if the holding voltage of the device is lower than the supply voltage, this leads to latch-up. An example of this approach can be found in U.S. Pat. No. 6,803,633.

U.S. Pat. No. 6,281,527 and 6,147,369 disclose electrostatics discharge protection circuit with high trigger current. The disadvantage of these patents is that the trigger current is increased.

U.S. Pat. No. 5,493,133 is similar in structure as the U.S. Pat. Nos. 6,281,527 and 6,147,369 described above, and further includes another function by adding a second collector for conducting the reverse current though a PNP. Also, U.S. Pat. No. 5,493,133 fails to disclose any type of influence to trigger the SCR.

In U.S. Pat. No. 6,433,368, the ESD protection circuit includes an extra collector added in the Nwell; however, the disadvantage of this extra collector is that the SCR then no longer functions as a SCR. Also, a zener diode is placed in series with the cathode of the SCR, which lowers the failure current resulting in only the PNP conducting current. Also the P+ is connected direct to ground resulting in a higher trigger current.

In U.S. Pat. No. 6,570,226, in the ESD protection circuit the second collector of the PNP is connected to the second collector of the NPN. This way, the Nwell/P+ junction in series with an N+/Well junction will be the trigger of the SCR instead of the Nwell/PWell breakdown, resulting in lower trigger voltage. Since these seed collectors are not coupled to anode or cathode they will not serve to increase the holding voltage/current.

U.S. Pat. No. 7,123,054 also uses a second NPN in the ESD protection circuit, but it is separate bipolar transistor, thus falls to operate as an SCR. Further disadvantage is that trigger current is also increased.

U.S. Pat. No. 6,720,624 adds a P+ emitter to the drain of the ESD device resulting in both usage of larger area and increase in trigger current.

In U.S. Patent Publication No. 2004/0100745, the parasitic resistance of the SCR in the ESD circuit is also shunted to ground (P+ in substrate). Further, by placing the P+ over the Nwell, the spacing between anode cathode becomes larger due uncertainly about the exact location of the Nwell.

"Dynamic Holding Voltage SCR (DHVSCR) Device for ESD Protection with high latch-up Immunity", Zi-Pin Chen et. al. also discloses a resistor to be a MOS transistor placed in the LAC (between anode and cathode) similar to the technique described in U.S. Pat. No. 6,803,633 which leads to latch up.

Thus, there is a need in the art to provide a protection technique for ESD protection that overcomes the disadvantages of the above discussed prior art where an increase in trigger voltage/holding is required during normal operation and thus a better latch-up immunity.

SUMMARY OF THE INVENTION

The preset invention provides an electrostatic disc (ESD) protection circuit having an SCR including at least a PNP transistor and at least a NPN transistor. The PNP transistor is coupled to an anode and the NPN transistor coupled to a cathode. The PNP transistor including a PNP first base, a PNP first emitter and a PNP first collector. The NPN transistor including a NPN first base, a NPN first emitter and a NPN first collector. The PNP first emitter is coupled to the anode, the first PNP base is coupled to the NPN first collector, the PNP first collector is coupled to the NPN first base and the NPN first emitter is coupled to the cathode. One of the PNP transistor and the NPN transistor having at least one second collector. The control circuit coupled between the anode and the cathode and also coupled to the second collector to control holding voltage of the SCR.

BRIEF DESCRIPTION OF THE DRAWINGS

The preset invention will be more readily understood from the detailed description of exemplary embodiments presented below considered in conjunction with the attached drawings, of which.

It is to be understood that the attached drawings are for purposes of illustrating the concepts of the invention.

DETAILED DESCRIPTION OF THE INVENTION

The present invention provides an improved ESD protection device which increases the holding voltage of the snapback devices during normal operation, thus greatly improving the latch-up immunity. The invention employs minority carrier guard-bands in order to control the triggering/clamping behavior of an SCR. It increases the holding voltage of the SCR during normal operation by deteriorating the feedback cycle. The guard-band is controlled by a normal-operation detection circuit. Some of the advantages include higher trigger voltage and higher trigger current and higher holding voltage and holding current resulting in fast triggering during ESD yet remain latch-up safe during normal operation.

Figure 1A:
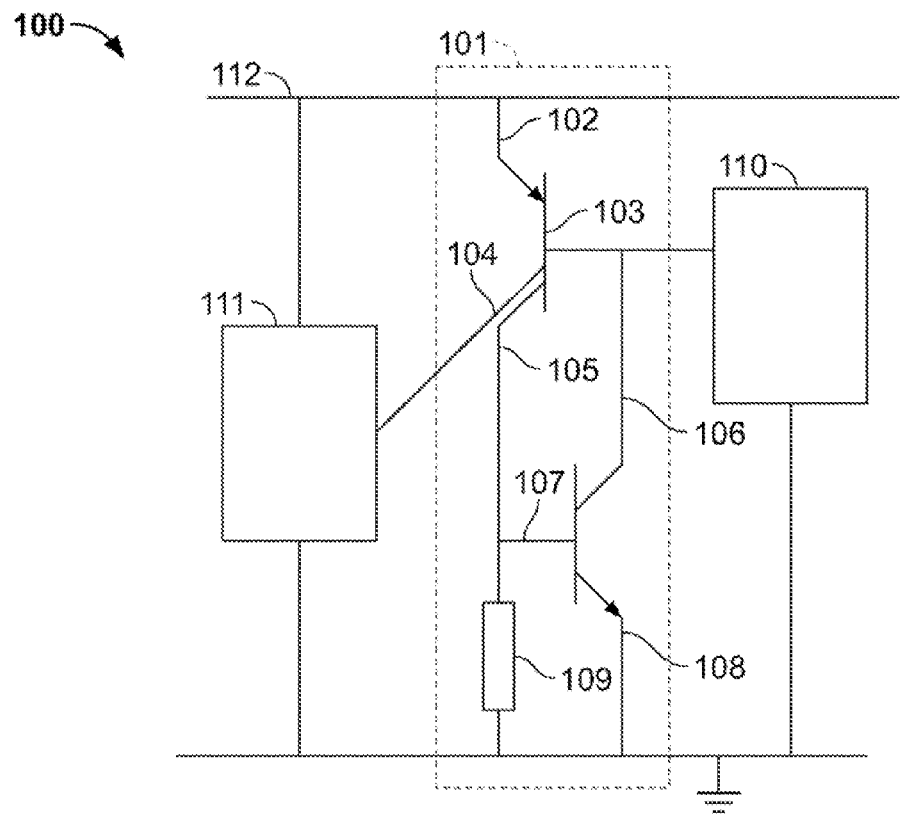
FIG. 1A and FIG. 1B illustrate a block circuit and cross section diagram respectively of an ESD protection device in accordance with an embodiment of the present invention
Figure 1B:
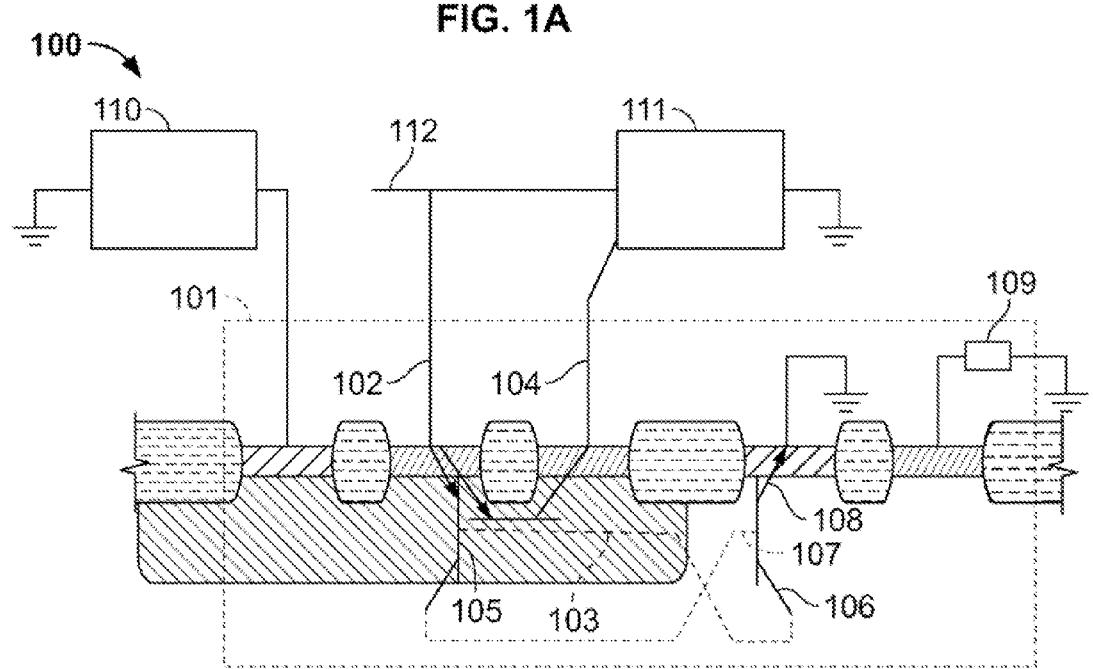

FIG. 1A and FIG. 1B show a block circuit and cross section diagram respectively of an ESD protection device 100 in accordance with an embodiment of the present invention. As shown, an SCR 101 is formed by a PNP with emitter (E) 102, base (B) 103 and collector (C) 105 and an NPN with collector (C) 106, base (B) 107 and emitter (E) 108. The emitter 102 of the PNP is coupled to the node 112 which may preferably be connected to any supply voltage such as I/O, Vdd, anode of the SCR and like. The base 107 is connected to ground through a resistor 109 that may preferably be externally added as shown or alternatively be intrinsic to substrate resistance of the SCR 101. As shown in FIG. 1A, a trigger circuit 110 is coupled to the base 103 of the PNP of the SCR 101. Alternatively, the device 100 may not include a trigger circuit 100, then the SCR 101 will trigger on intrinsic Nwell/Pwell breakdown. The SCR 101 is triggered during ESD by the trigger circuit 110 at a certain voltage Vt1. Additionally, a node 104 which functions as an additional collector is added near the anode 102 of the SCR which in turn results in forming a parasitic PNP 120 with E 102, B 103 and C 104. This parasitic PNP 120 shares an E 102 and B 103 with the PNP of the SCR 101. As shown, the collector 104 is connected to a normal-operation detection circuit 111, which is coupled between a voltage supply node 112 and ground. This circuit 111 functions to control the current received from the node 104 such as it serves to float node 104 during ESD circumstances or during the first part of the ESD circumstances and shunt the current to ground during normal operation circumstances as will be described in greater detail below.

During part of the ESD stress (unpowered ESD device) where the SCR 101 triggers, circuit 111 floats node 104, i.e. node 104 is not connected to ground. In this situation, the circuit 111 has no influence on the triggering behavior of the SCR 101, which is then dictated by the properties of the trigger circuit 110. However, during normal operation or after triggering, (powered ESD device 100) circuit 111 ties the node 104 to ground. Since during normal operation, there is current flowing into the B 103 of the SCR, the bipolar transistor pnp is forward biased. So, part of the current is diverted to node 104, which now acts as a second collector in the SCR 101 and competes with collector 105 to collect current injected by emitter 102. This current extracted by the additional collector node 104 is directed by the circuit 111 to ground. Both collectors 104 and 105 always operate simultaneously since they share emitter and drain. The ratio at which the collectors 104 and 105 collect current is determined by geometry and collector doping. The larger the surface area of the SCR 101, the more current can be collected. Collected 104 thus acts as a minority current carrier guard-band that takes current away before they can reach the Nwell-Pwell junction at collector 105 of the SCR 101. In this embodiment, the additional collector 104 is P+ type guard-band since it is connected to the pnp of the SCR 101.

As discussed above, more current is extracted from the SCR 101. Since more current is extracted from the SCR 101, a higher voltage over the SCR 101 is needed to maintain the same current in the SCR, which means that the holding voltage or minimum voltage needed to maintain the SCR operation is increased. Also, during triggering if the collector node 104 is connected to ground, more trigger current than normal is needed to trigger the SCR 101, which means higher trigger voltage. In most ESD cases, it is preferred to have a lower triggering voltage to stay within a design mode. However, in the present invention, during normal operation, more voltage needs to be applied over the E 102 and B 103 junction so that more current is injected. This results in an increase in the trigger voltage of the device 100 during normal operation.

Also, when SCR 101 triggers during normal operation, the collector node 104 is grounded, which slowly turns off the SCR 101 resulting in an increase in the holding voltage (the minimum voltage required for operation) of the ESI device 100. However, during ESD stress, the triggering voltage is still low, then circuit 111 functions to control the collector 104 so it is floating (i.e. not connected) so there is no current being extracted to ground.

In some embodiments, an extra low doped region or an extended well region may preferably be placed under the collector 104. This will increase the breakdown voltage of the junction resulting in a lower leakage during normal operation.

The additional collector 104 may also be placed preferably outside the region between the anode 102 and the cathode 108 in accordance with a preferred embodiment of the present invention. This will decrease the distance between the anode 102 and the cathode 108, which increases the initial triggering speed. Also, the beta or efficiency of the collector 105 will be higher then the extra collector 104 since more current will remain in the SCR 101. So, with the same amount of voltage, i.e. holding voltage required for the operation of the SCR 101, more current may be extracted via the collector 105 which will be used to trigger the SCR 101 faster. Thus, in this embodiment, an optimum between the trigger speed and holding voltage can be found.

Figure 1C:
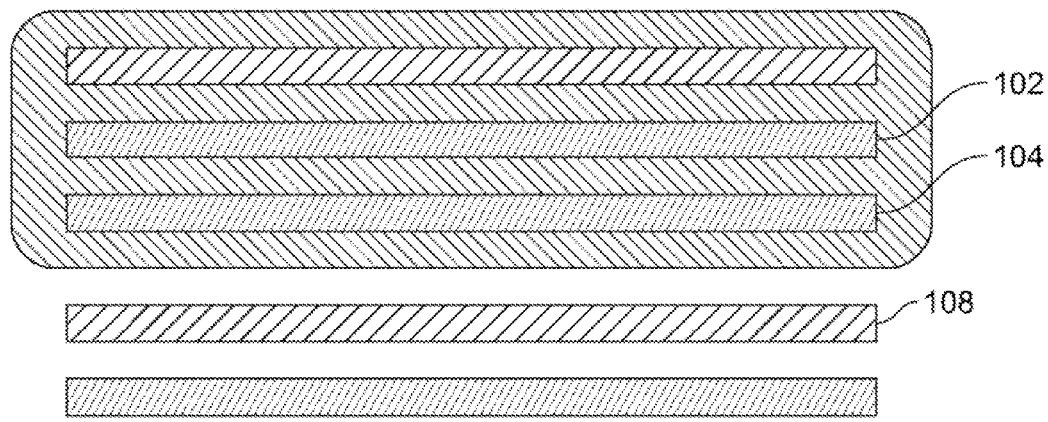
FIG. 1C, 1D, 1E, 1F, 1H and 1I illustrate a top view of layout of the cross section diagram of FIG. 1A in accordance with various alternate embodiments of the present invention.
Figure 1D:
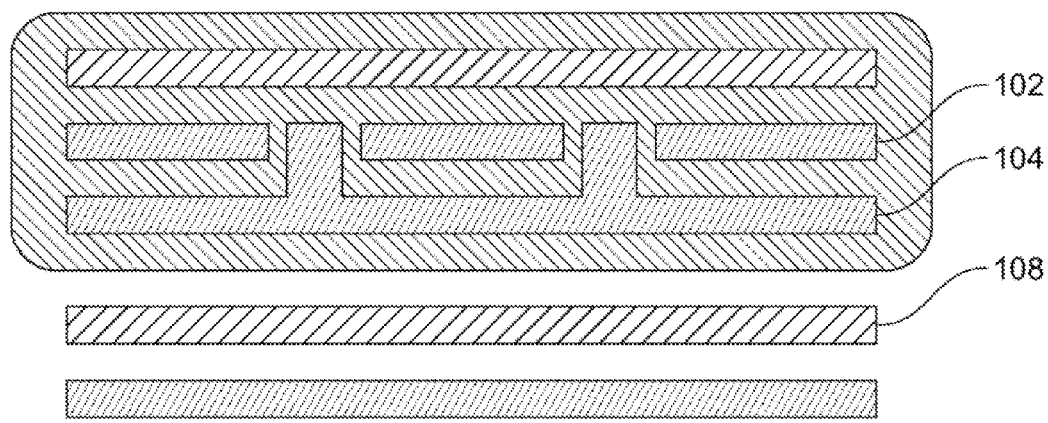
Figure 1E:
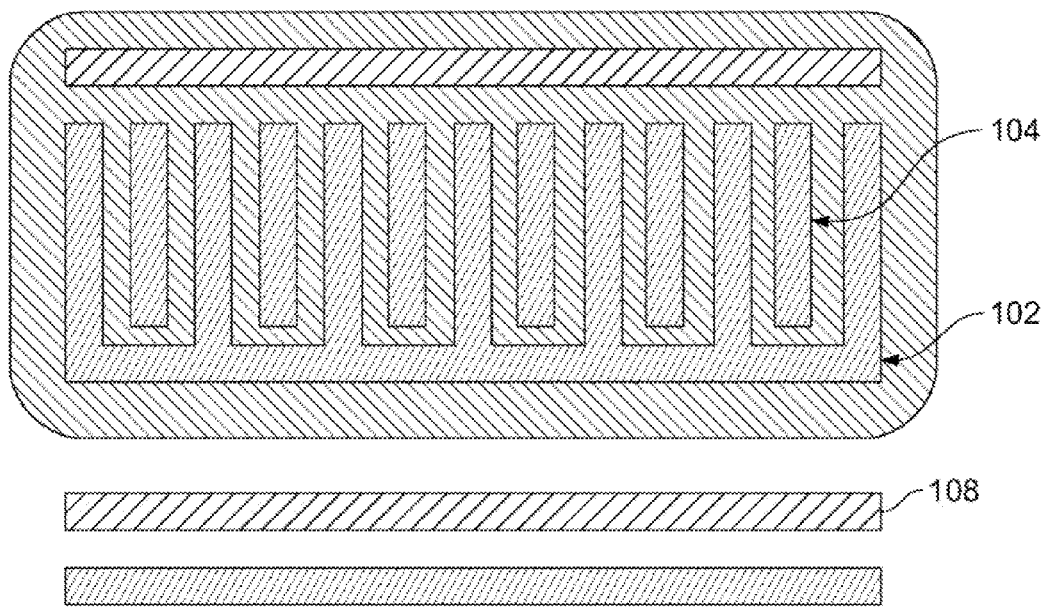
Figure 1F:
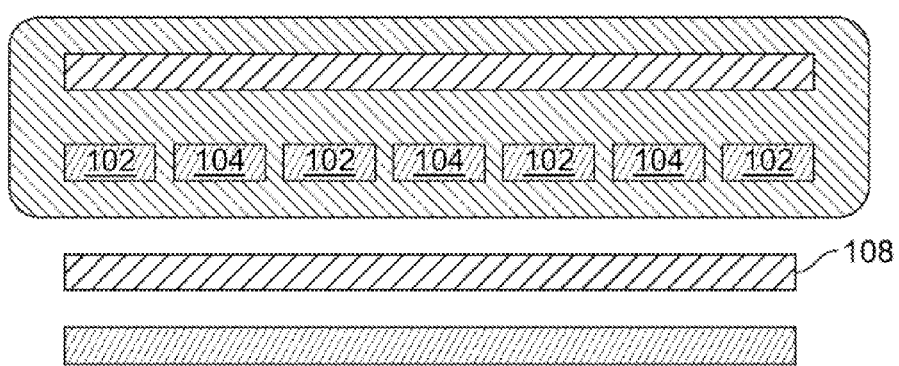
Figure 1G:
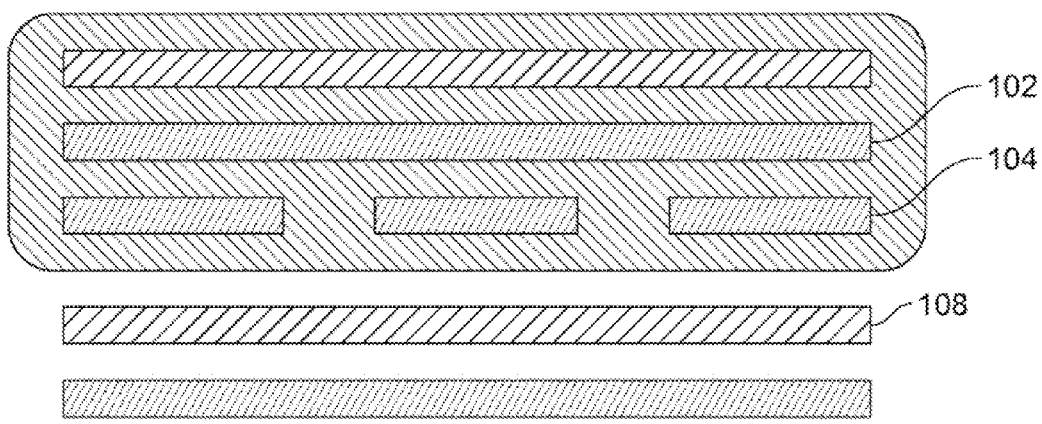
Figure 1H:
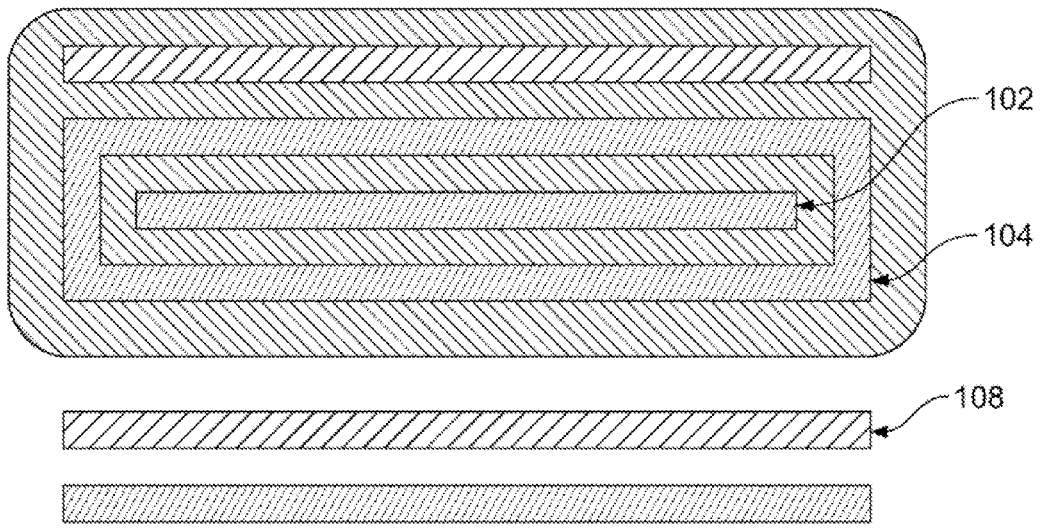
Figure 1I:
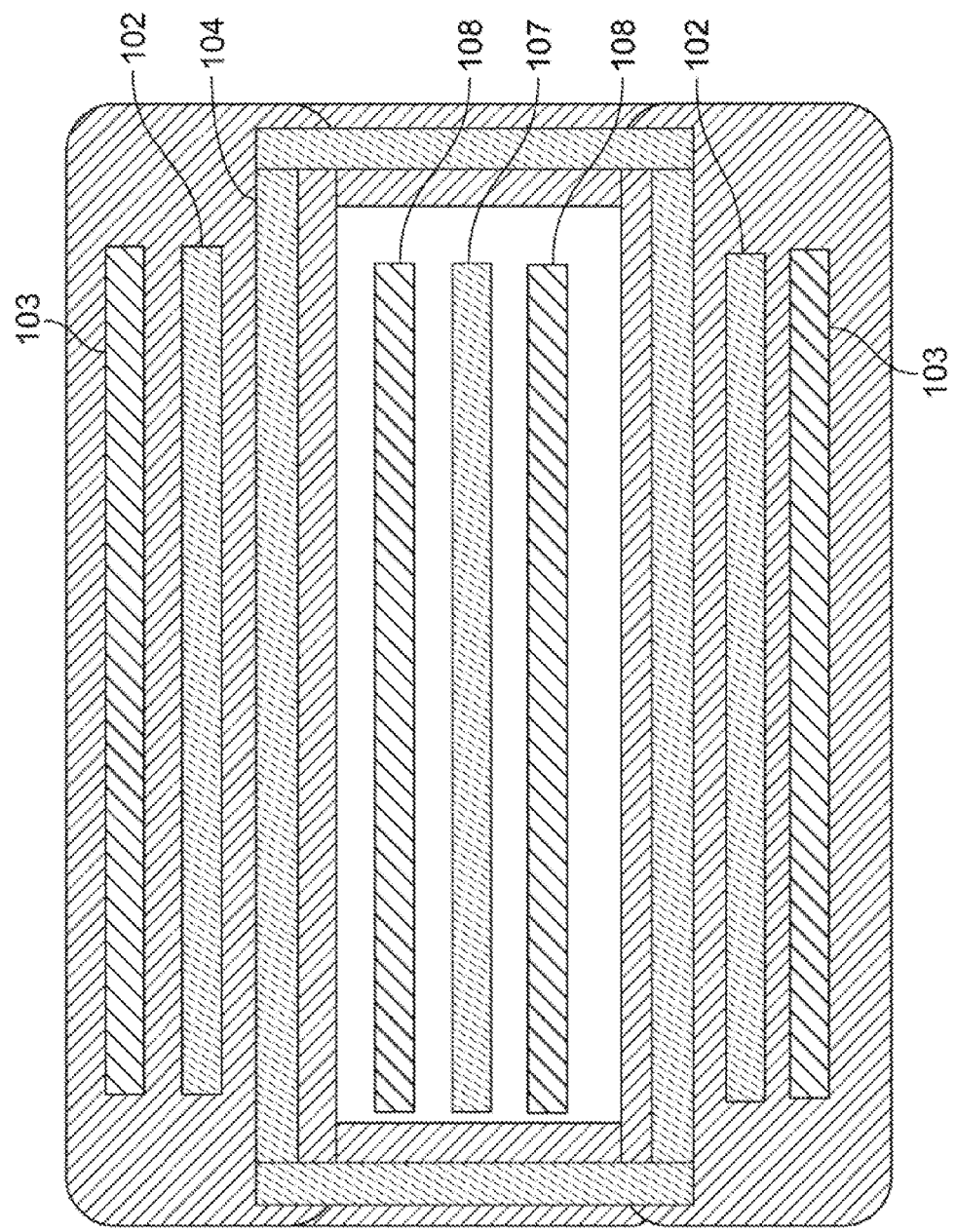

FIG. 1C, 1D, 1E, 1F, 1G, 1H and 1I illustrate a top view of different layouts of the cross section diagram of FIG. 1B in which the additional P+ collector is used. FIG. 1C shows a layout of the additional collector P+ 104 laid in parallel to the anode 102 of the SCR 101. FIG. 1D show the anode 102 divided into three segments with additional collector P+ 104 is extended in between the segments. FIG. 1E shows the anode 102 with segments stretched out with the P+ 104 formed between the segments. Alternatively, FIG. 1F shows only the extended part of the P+ 104 is formed between the segments, thus bringing the segments closer to each other. FIG. 1G shows a top view of the layout is where the additional collector P+ 104 is divided into segments and laid out parallel to the anode 102 of the SCR 101. The advantage of this lay out is that the strength of the second collector 104 can be controlled by the amount of current that is extracted from the SCR. FIG. 1H shows the P+ 104 forming a ring-like design surrounding the anode 102 of the SCR 101. FIG. 1I shows the doped region of the second collector 104 is disposed surrounding the emitter 108 and the base 107 of the NPN.

Figure 2A:
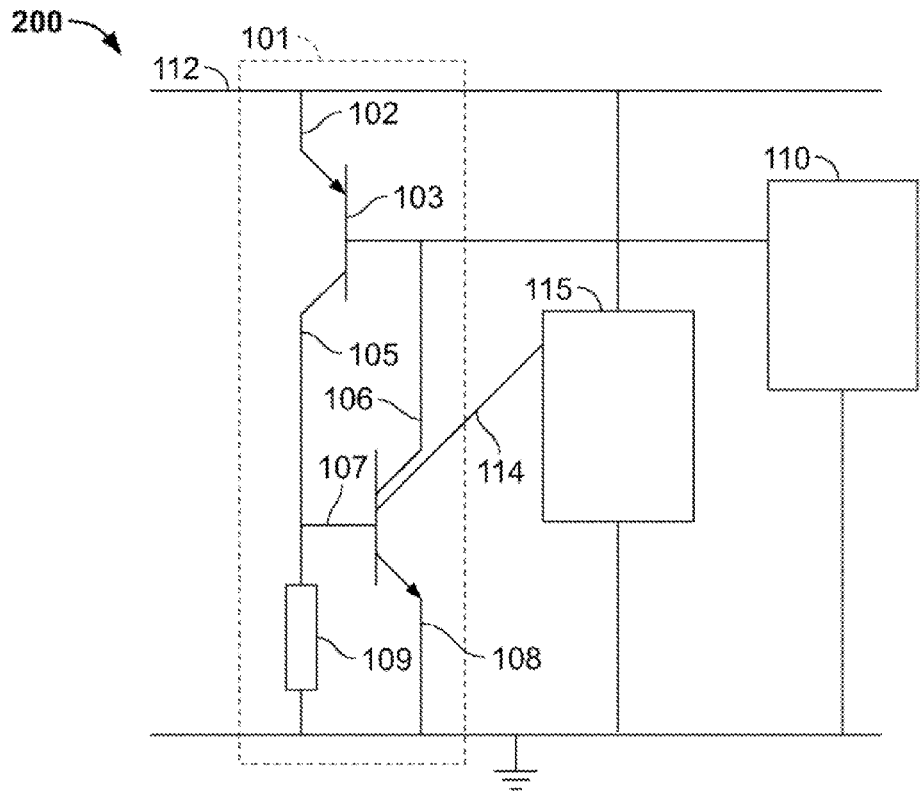
FIGS. 2A and 2B illustrate a block circuit and cross section diagram respectively of an ESD protection device in accordance with another embodiment of the present invention.
Figure 2B:
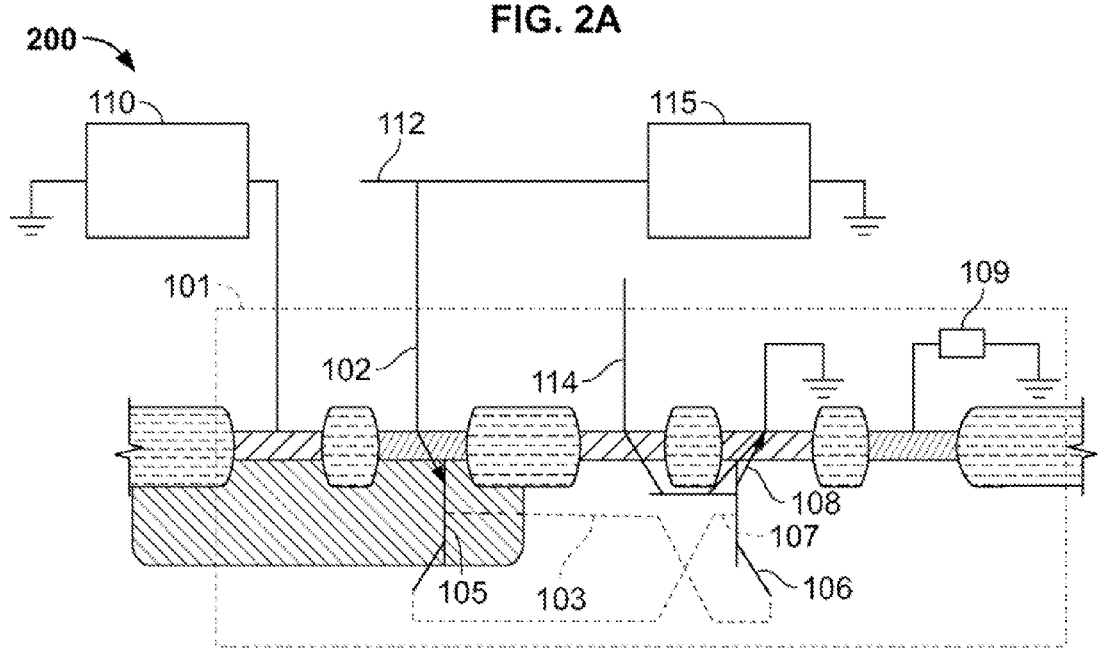

In an alternate embodiment of the present invention, an N+ guard-band acts as a parasitic collector. This embodiment is disclosed in the block circuit and the cross-section diagram respectively of the ESD protection device 200 of FIGS. 2A and 2B. In this embodiment, the N+ guard-band is an additional collector 114 of the npn with C 106, B 107 and E 108. The additional collector 114 is connected to the normal-operation detection or control circuit 115 as shown in FIGS. 2A and 2B. The additional collector 114 and the control circuit 115 of FIG. 2 is analogous to the additional collector 104 and the control circuit 111 of FIG. 1. Note that the operation of the ESD device 200 in FIG. 2 functions the same as the device 100 of FIG. 1 except that during normal operation the control circuit 115 connects the additional collector 114 to the Vdd/anode 102 (instead to ground FIG. 1). When the extra collector 114 is couple to the anode 112, a part of the current that flows through the base 107 emitter 108 junction of the NPN will be collected from this extra collector 114, and thus less current is collected from the collector 106 in the SCR. So for maintaining the same minimum current to hold the SCR 101 in an ON-mode, the voltage must be increased, resulting in a higher holding voltage.

Figure 2C:
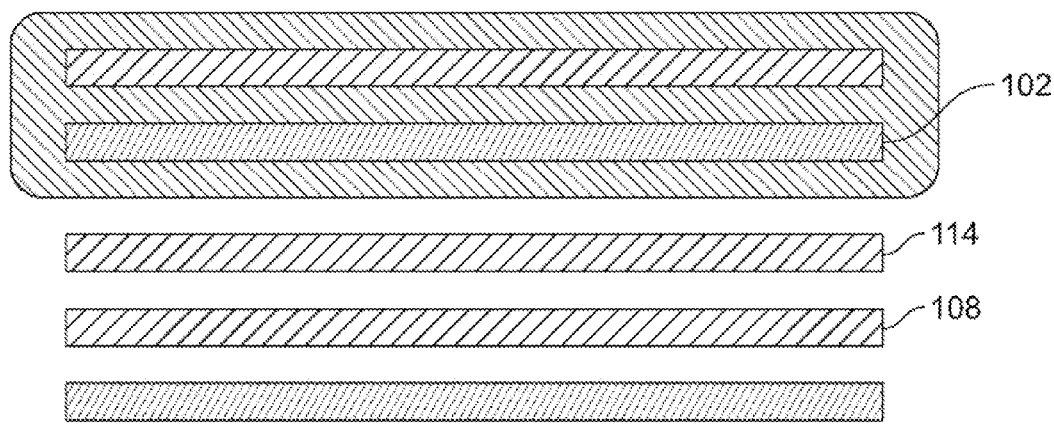
FIGS. 2C, 2D, 2E, 2F, 2G, 2H and 2I illustrate a top view of layout of the cross section diagram of FIG. 2A in accordance with an alternate embodiment of the present invention.
Figure 2D:
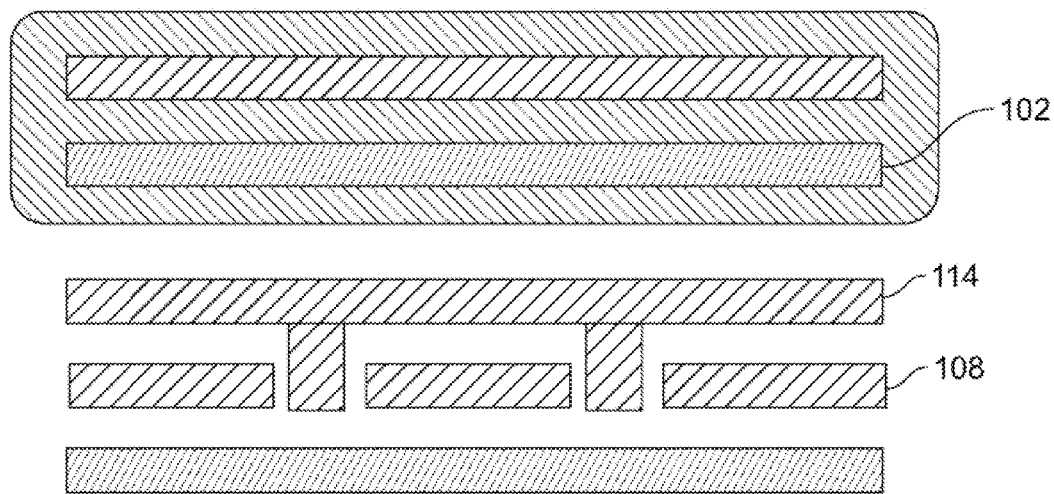
Figure 2E:
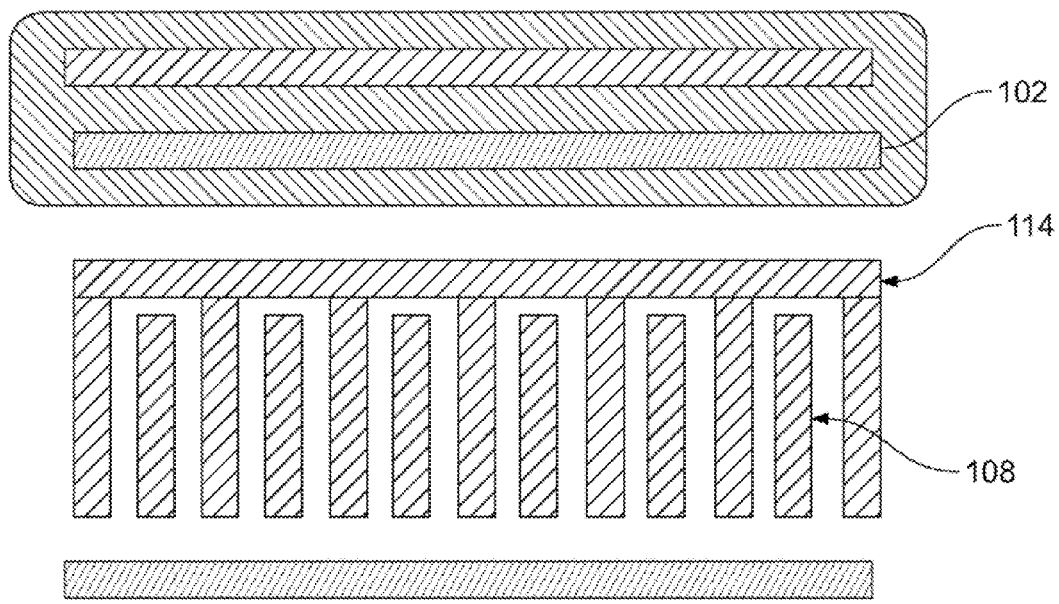
Figure 2F:
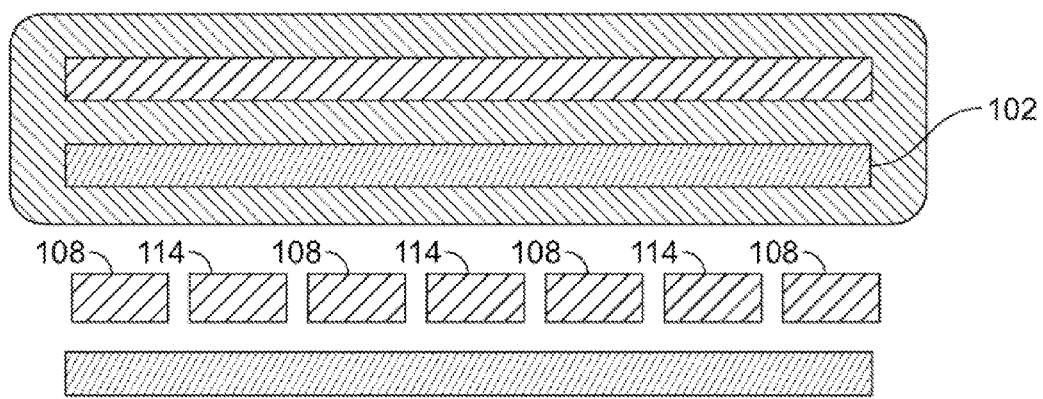
Figure 2G:
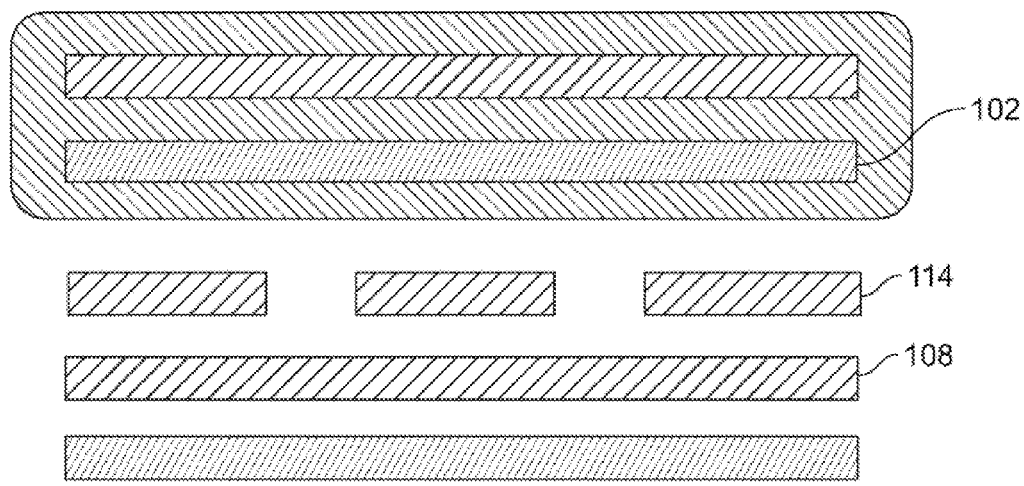
Figure 2H:
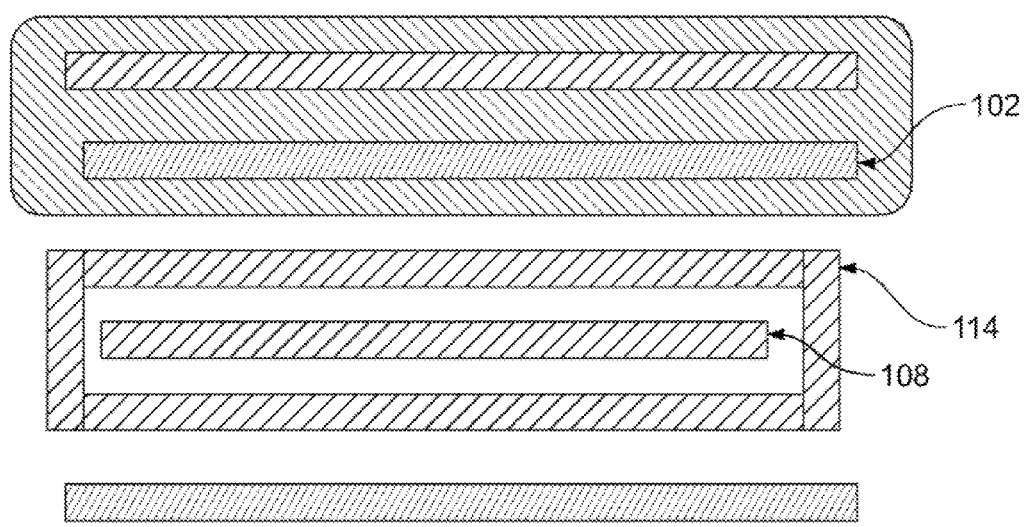
Figure 2I:
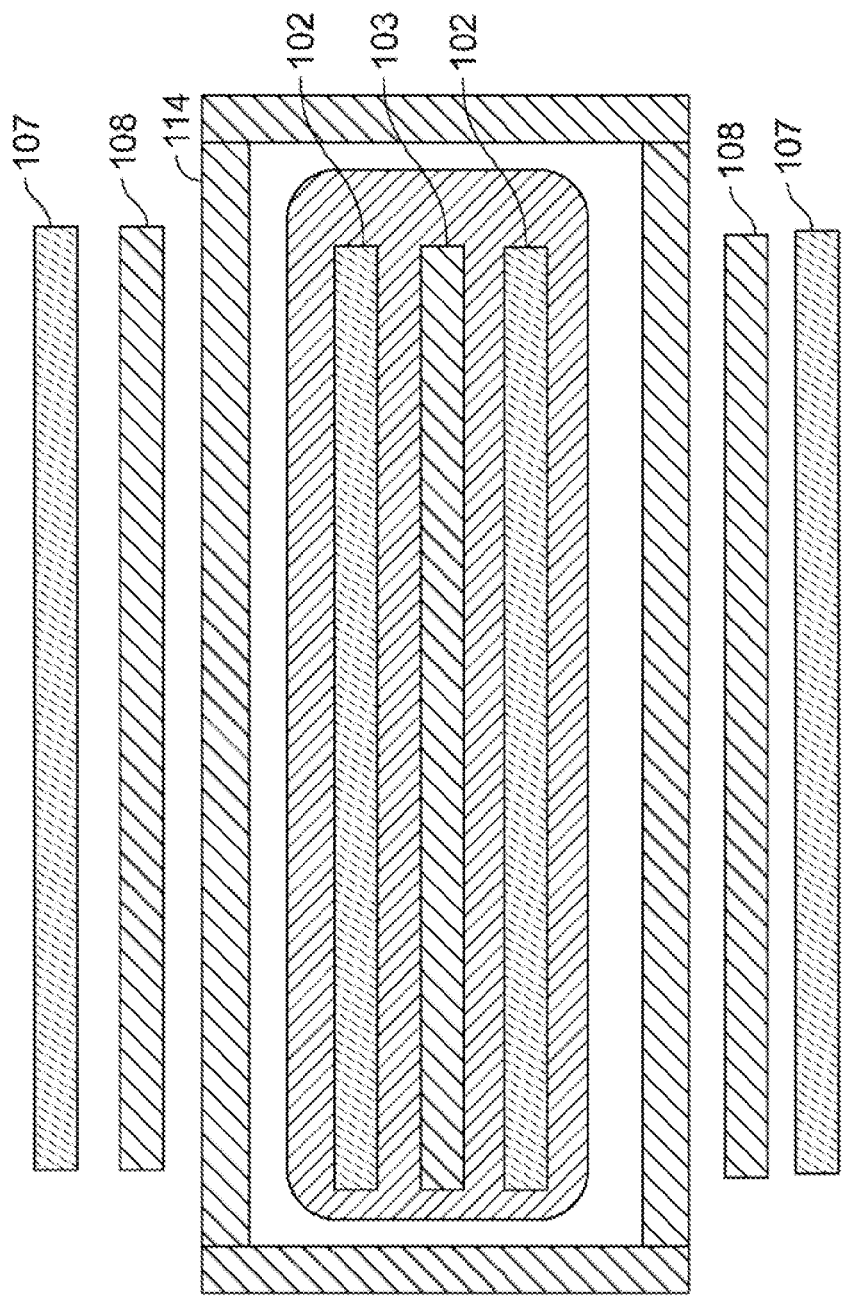

FIG. 2C illustrates a top view of the layout of the cross section diagram of FIG. 2B in which the additional N+ collector 114 is laid out in parallel to the cathode 108 of the SCR. FIG. 2D show the anode cathode 108 divided into three segments with additional collector N+ 114 is extended in between the segments. FIG. 2E shows the cathode 108 with segments stretched out with the N+ 114 formed between the segments. Alternatively, FIG. 2F shows only the extended part of the N+ 114 is formed between the segments, thus bringing the segments closer to each other. FIG. 2G shows a top view of the layout is where the additional collector N+ 114 is divided into segments and laid out parallel to the cathode 108 of the SCR 101. The advantage of this lay out is that the strength of the second collector 114 can be controlled by the amount of current that is extracted from the SCR. FIG. 2H shows the N+ 114 forming a ring-like design surrounding the cathode 108 of the SCR 101. FIG. 2I shows the doped region of the second collector 114 is disposed surrounding the emitter 102 and the base 103 of the PNP.

In the embodiments described above with respect to FIGS. 1 and 2, the trigger circuit 110 is preferably connected to the gate 103 of the SCR 101, however, the trigger circuit 110 may preferably be connected to gate 107 of the SCR 101 (not shown) or alternatively be placed in series between the gate 103 and 107 of the SCR 101 (not shown) or even two trigger circuits may be used such that one is connected to the gate 107 and the other is connected to the gate 103. One of ordinary skill in the art would appreciate that any conceivable form of trigger circuit and the trigger circuit connection could be used in the present invention. The trigger device 110 may preferably include elements such as a RC transient detector, inverters, MOS, diodes, SCR, resistors, and like, or combination of these elements. Additionally, the control circuit may preferably include RC, MOS, diodes, resistors, zener diode, grounded NMOS, inverters and like or combination of these elements.

Figure 3A:
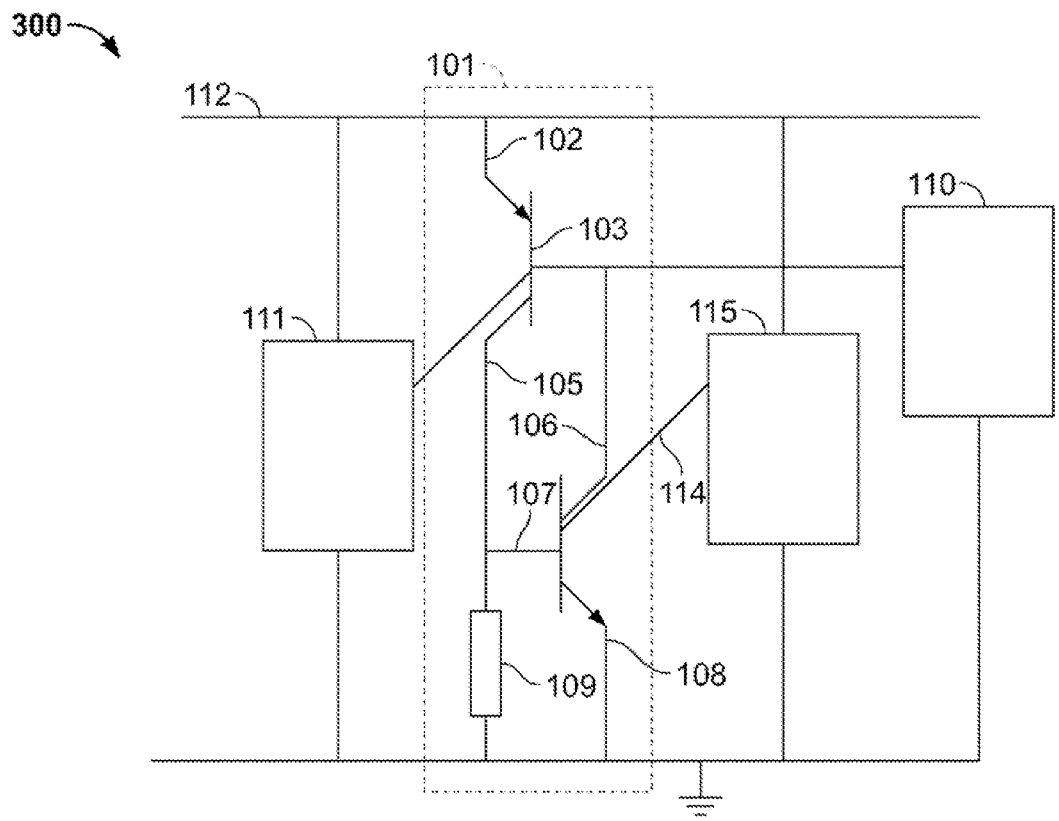
FIGS. 3A and 3B illustrate a block circuit and cross section diagram respectively of an ESD protection device in accordance with further embodiment of the present invention.

Referring to FIG. 3A, there is shown an ESD protection device 300 as another alternate embodiment of the present invention. As illustrated the device 300 includes both the additional P+ collector 104 with its corresponding control circuit 111 and the additional N+ collector with its corresponding control circuit 115. Note that ESD protection device 300 is a combination of structures of device 100 shown in FIG. 1 and the device 200 shown in FIG. 2. Thus, it is noted that the operation of the device in FIG. 3 is the same as described in FIG. 1 and FIG. 2 with both mechanisms working together.

Figure 3B:
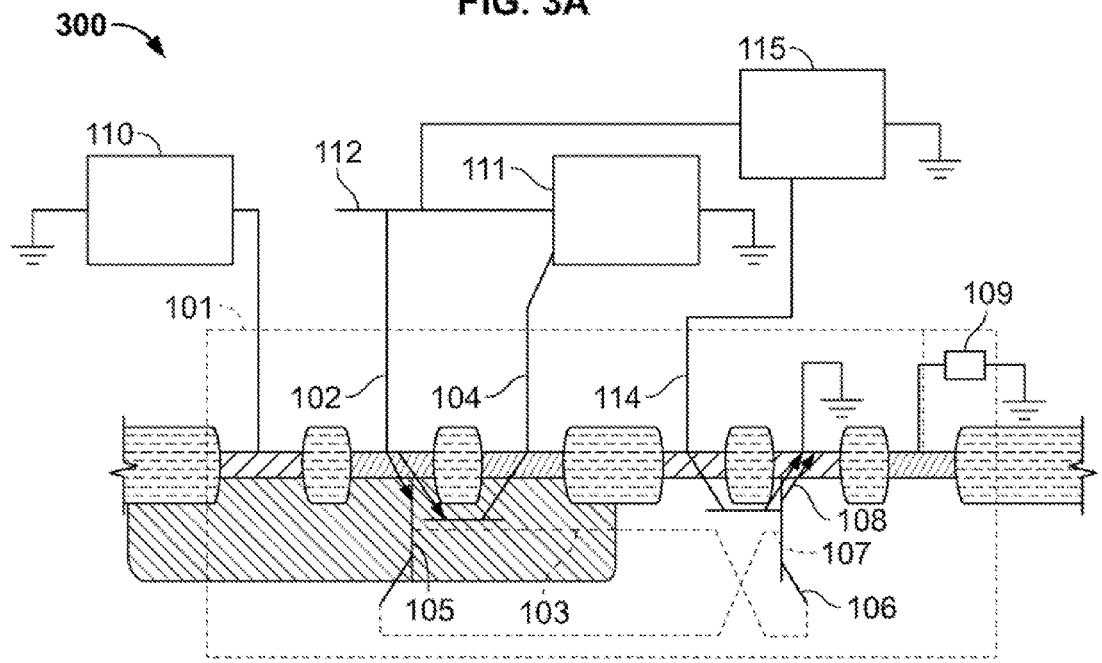
Figure 3C:
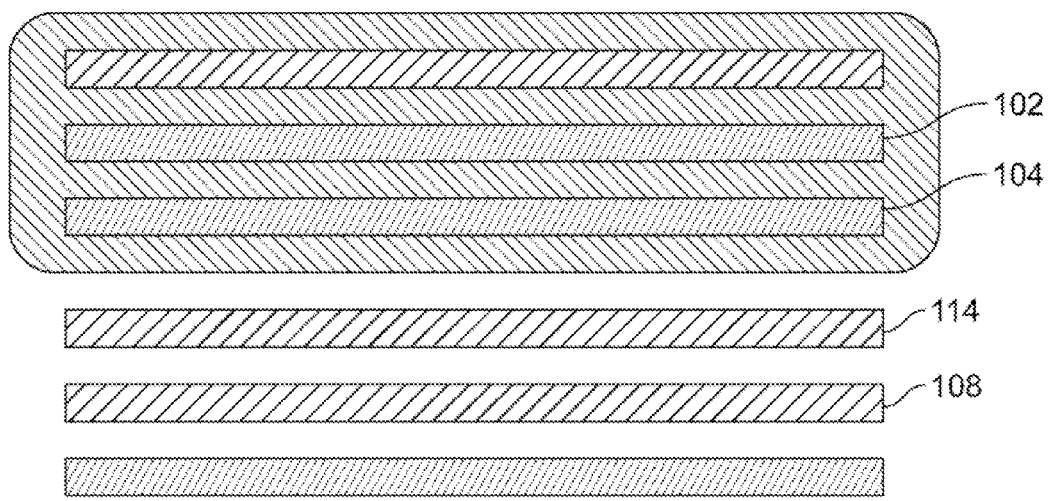
FIG. 3C illustrates a top view of layout of the cross section diagram of FIG. 3B in accordance with an alternate embodiment of the present invention.

FIG. 3B illustrates a top view of the layout of the cross section diagram of FIG. 3A in which the additional P+ collector 104 is laid out in parallel to the anode 104 and the additional N+ collector 114 is laid out in parallel to the cathode 108 of the SCR. Although not shown, other layouts as discussed above with respect to FIGS. 1C-1I and 2C can preferably be implemented with the both the additional collector P+ 104 and the additional collector N+ 114 with respect to the anode 104 and the cathode 108 respectively.

Figures 4A, 4B:
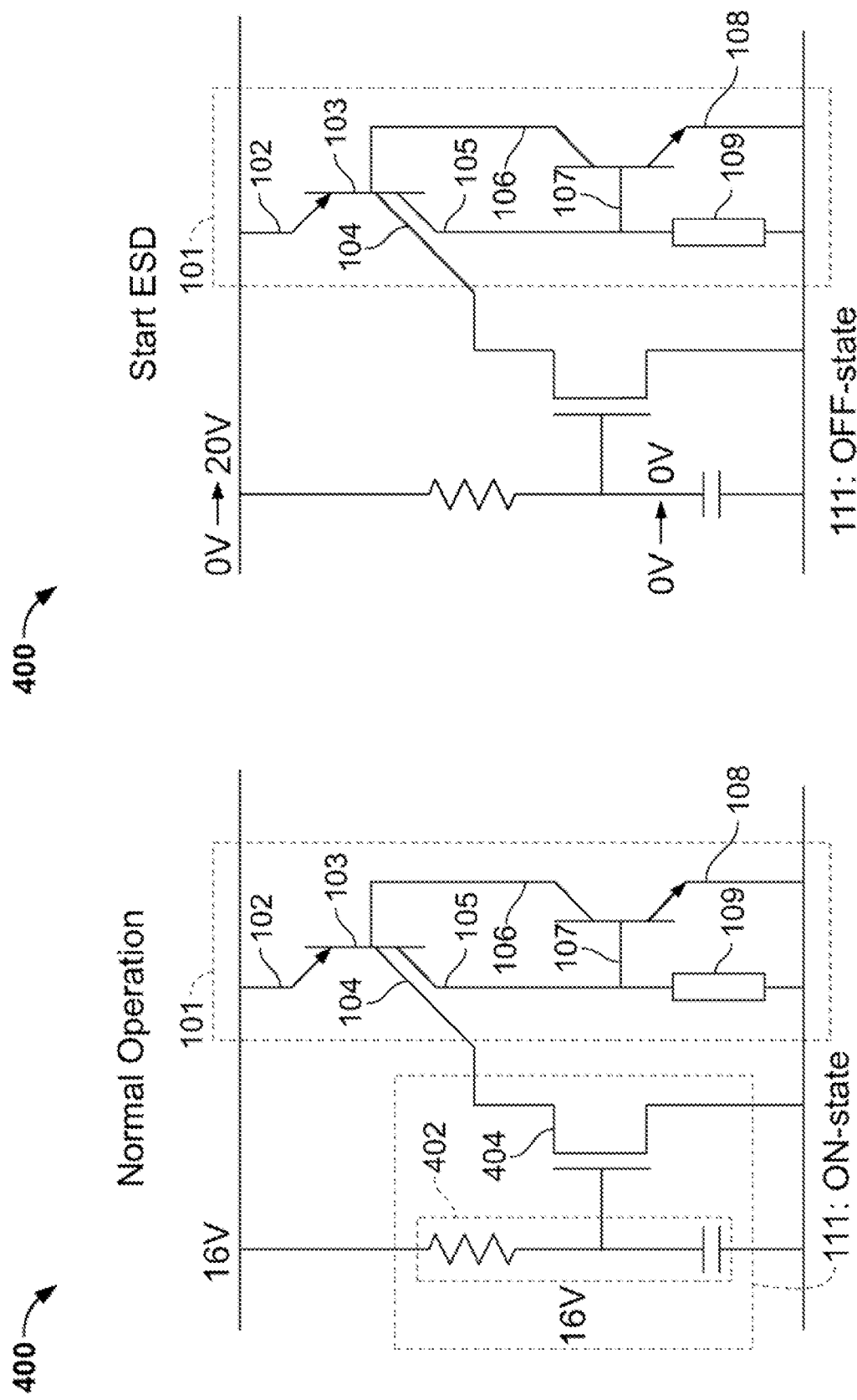
FIG. 4 illustrates a preferred embodiment of the control circuit of the ESD protection device of FIG. 1.

Referring to FIG. 4, there is an operation of an ESD protection device 400 in which the control circuit 111 of FIG. 1 is a RC MOS circuit in accordance with a preferred embodiment of the present invention. As illustrated in FIG. 4, the control circuit 111 is a combination of an RC circuit 402 with the NMOS 404. In the RC circuit 402, C is connecting the gate of the NMOS 404 to ground and the R connecting the gate of the NMOS 404 to the anode of the SCR 101. Note that a trigger circuit is not shown in this figure. During normal operation as shown in FIG. 4A, the holding voltage is at for example 16V, then C at the gate of the NMOS 404 will be also charged up to 16V, turning the NMOS 404 ON (i.e. in an ON state). As discussed above, during normal operation, the control circuit, i.e. RC-NMOS ties the node of the additional collector 104 to ground, thus directing all the current collected by the additional collector 104 to ground.

During the start of the ESD, the voltage before the ESD stress is 0V as shown in FIG. 1B, thus the gate voltage of the NMOS 404 is also at 0V, turning the NMOS 404 OFF. As discussed above, in the ESD stage, the node to the additional collector 104 is floating and not connected to the SCR 101. Due to the ESD pulse, there is transient voltage of for example about 20V due as shown. Due to this change in voltage at the start of ESD, there will be a current flowing from the emitter 102 to base 103 and being collected at the collector 105 only. Since collector 104 is floating, the lower trigger current is maintained and initial the holding voltage can be low, for example about 2V. Then during ESD as shown in FIG. 4C, the capacitance C will start to charge up and there will be voltage built up at the gate of the NMOS 404. After some time C will also charge up towards the holding voltage of, for example, about 2V, turning the NMOS in the ON state as shown in FIG. 4C. Soon after, as shown in FIG. 4D, the gate of the NMOS 404 is charge and NMOS 404 starts to become active. This will connect the collector 104 to ground. Current will be extracted from the SCR 101 resulting in an increase in holding voltage from 2V to 18V returning back to normal operation. At this stage the SCR 101 is triggered and the current collected by the additional collector 104 shunts to ground via the control circuit, i.e the RC 402 and the NMOS 404, which slowly turns the SCR 101 in an OFF state. Thus, during ESD, the trigger voltage is not increased and SCR is triggered at the lower voltage value.

Figure 5A:
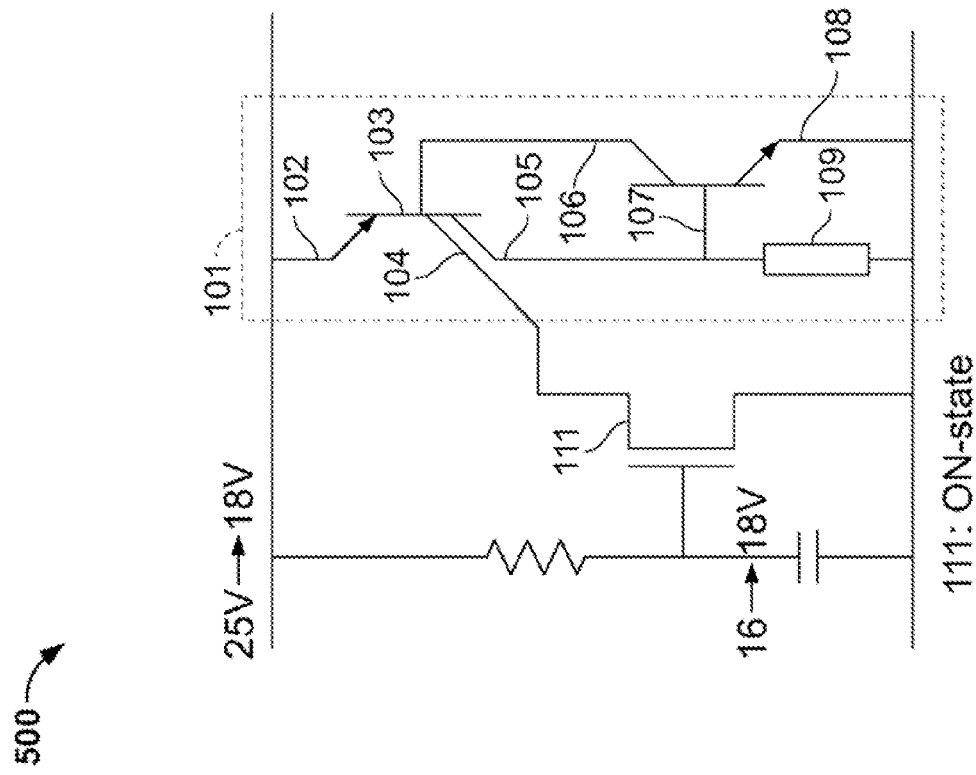
FIG. 5 illustrates another preferred embodiment of the control circuit of the ESD protection device of FIG. 1.
Figure 5B:
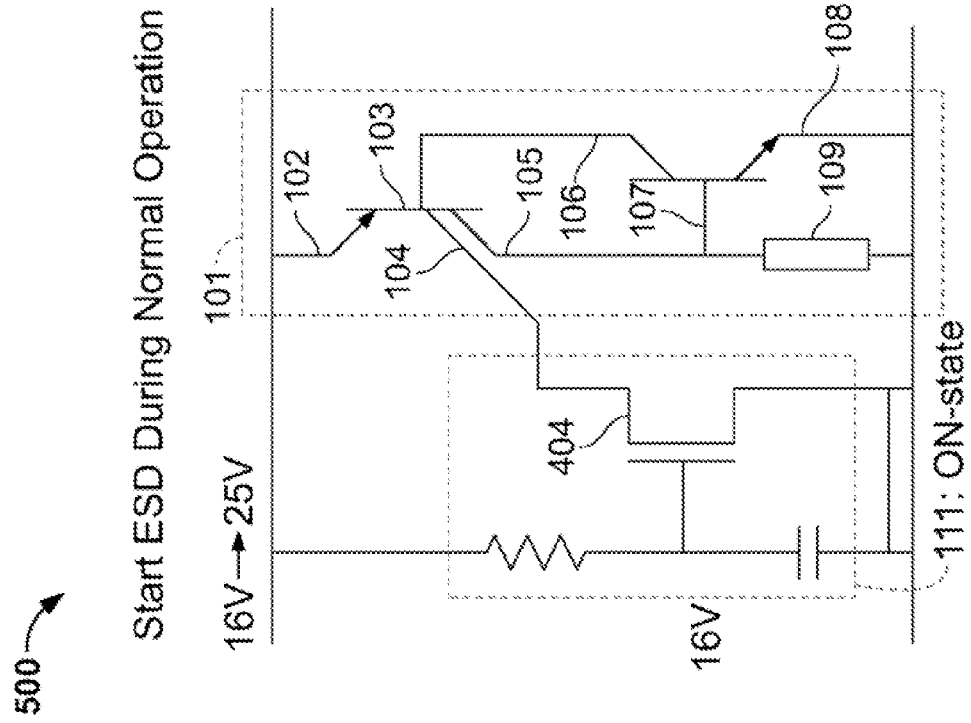

Referring to FIG. 5, there is shown an option of an ESD protection device 500 in which the control circuit 111 of FIG. 1 is a RC MOS circuit in accordance with another preferred embodiment of the present invention. During normal operation as shown in FIG. 5A, the holding voltage is at for example 16V, then C at the gate of the NMOS 404 will be also charged up to 16V, turning the NMOS 404 ON (i.e. in an ON state). As discussed above, during normal operation, the control circuit, i.e. RC-NMOS ties the node of the additional collector 104 to ground, thus directing all the current collected by the additional collector 104 to ground. There is an ESD stress during normal operation having an ESD pulse for example at 25 V that is applied to power supply. Since the NMOS 404 is already ON, the holding voltage lowers down only to 18V. So, the holding voltage 18V of the SCR 101 is higher than the power supply Vdd (16V). After the ESD stress is removed, the voltage returns to the normal operation voltage supply of 16V. Since the holding voltage (i.e. minimum voltage to maintain the SCR operation) is higher than the normal operation voltage, the SCR 101 will be turned OFF after the ESD source is removed. Thus, no supply voltage is left that is high enough to keep the SCR latched.

Figure 6:
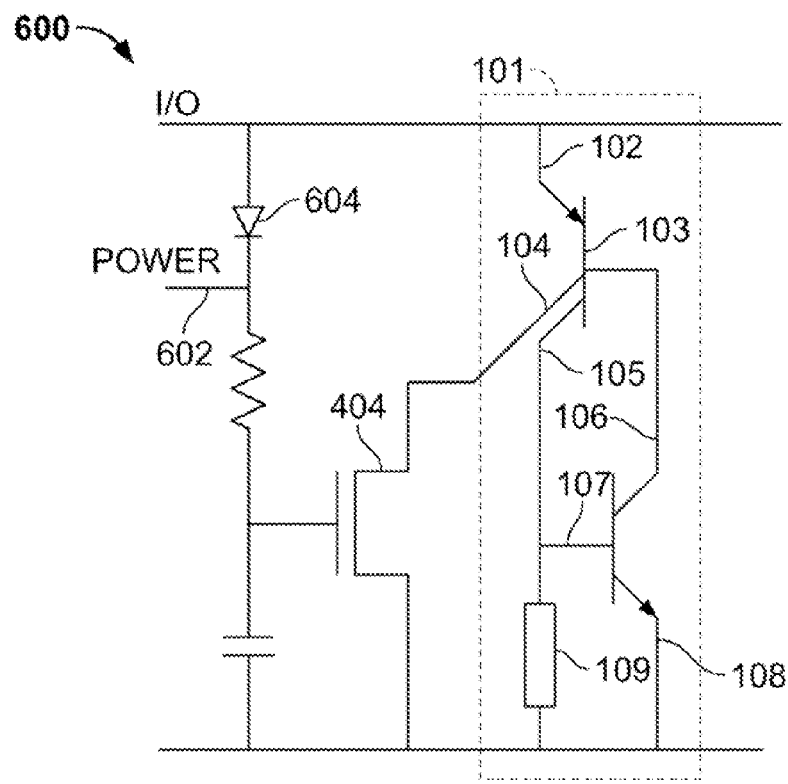
FIG. 6 illustrates the ESD protection device in accordance with an alternate preferred embodiment of the present invention.

Referring to FIG. 6, there is shown an ESD protection device 600 in accordance with an alternate preferred embodiment of the present invention. The device 600 is similar to device 400 with additional elements such as a second power supply 602 coupled to the RC 402 and a diode 604 coupled between the I/O and the second power supply 602. Note that the RC 402 is connected to the second power supply 602 and not directly to the anode of the SCR 101. By putting the second power supply 602 between the I/O and the C, the power supply is at a constant voltage which blocks the charges from the C. When it is a powered device, there is constant voltage due to the second power supply 602, and then during ESD, when the device is not powered, (i.e. no power floating, there is no power supply present) then it functions similar to the device 400. This result in low or no distortion at the gate of the NMOS 604 since the C will not be affected by the signal of I/O due the constant voltage supplied by the second power supply 602. During normal operation, the diode 104 will block any current flow from the I/O to the second power supply 602 since this diode 104 will be reversed biased. If the voltage of the I/O is higher than the voltage of the second power supply 602, then more than one diode is needed. Alternatively, diode 604 may be replaced with other circuits such as a MOS.

Figure 7A:
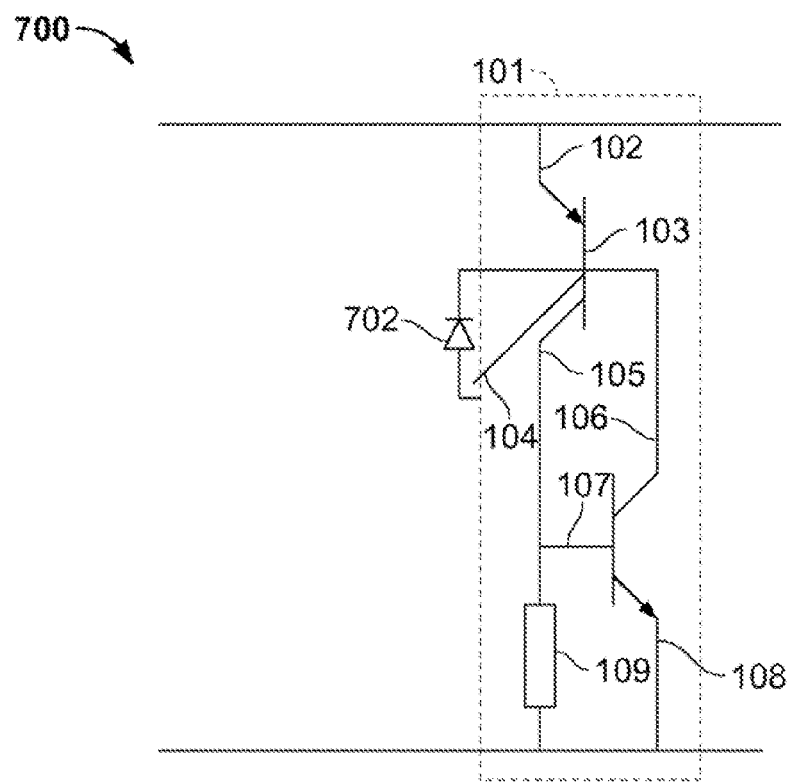
FIG. 7A illustrates the ESD protection device in accordance with another alternate preferred embodiment of the present invention.

Referring to FIG. 7A, there is shown an ESD protection device 700 in accordance with an alternate preferred embodiment of the present invention. The ESD protection device 700 is similar to the device 100 except that it does not include the additional control circuit 111. In this embodiment, a diode 702 is coupled between the additional collector 104 and the base 103 of the PNP of the SCR 101 as another means to control the additional collector 104. During ESD, if the SCR clamp 101 triggers, the voltage at the base 103 of the PNP will be below the emitter 102 of the PNP, i.e. below the Vss. When there is ESD, there is current flowing into the base 103 of the PNP transistor which is connected to the collector 106 of the NPN transistor. So, there is some part of the art flowing from the base 103 of the PNP transistor to the NPN transistor of the SCR 101 to ground and other part of the will flow to the additional collector 104 to the diode 702 returning back to the base 103 and then flowing into the NPN. Thus, instead of placing an additional control circuit 111 (for ex: a CMOS), the NPN of the SCR 101 is used to shunt the current to ground. In this way, part of the SCR 101 is used as a control circuit. One of the advantages of eliminating the separate control circuit is that the ESD structure will occupy less area and will operate at a lower voltage.

Figure 7B:
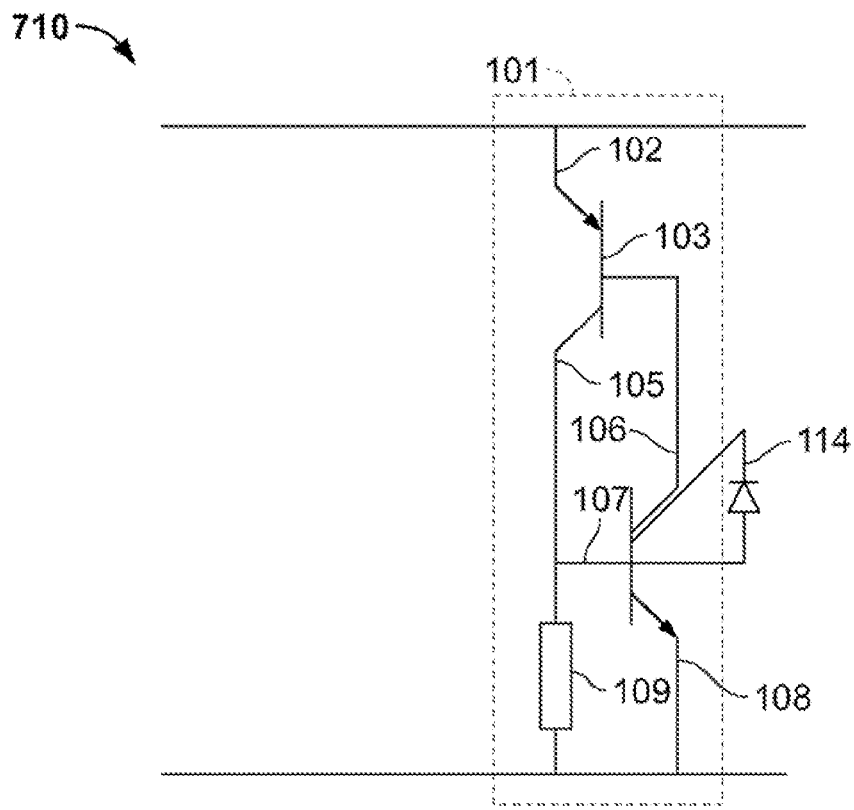
FIG. 7B is the ESD protection device in accordance with even another alternate preferred embodiment of the present invention.

Additionally, the diode 702 may preferably be placed between the additional collector 114 and the base 107 of the npn in the ESD device 710 as shown in FIG. 7B. The ESD protection device 710 is similar to the device 200 except that it does not include the additional control circuit 114 and is instead replaced with the diode 702. Alternatively, the diode 702a is coupled between the additional collector 104 and the base 103 of the pnp and diode 702b is coupled between the additional collector 114 and the base 107 of the npn as shown in the ESD device 720 in FIG. 7C. The ESD protection device 720 is similar to the device 300 except it does not include the additional control circuits 111 and 114 and is instead replaced with the diodes 702a and 702b respectively.

Figure 7C:
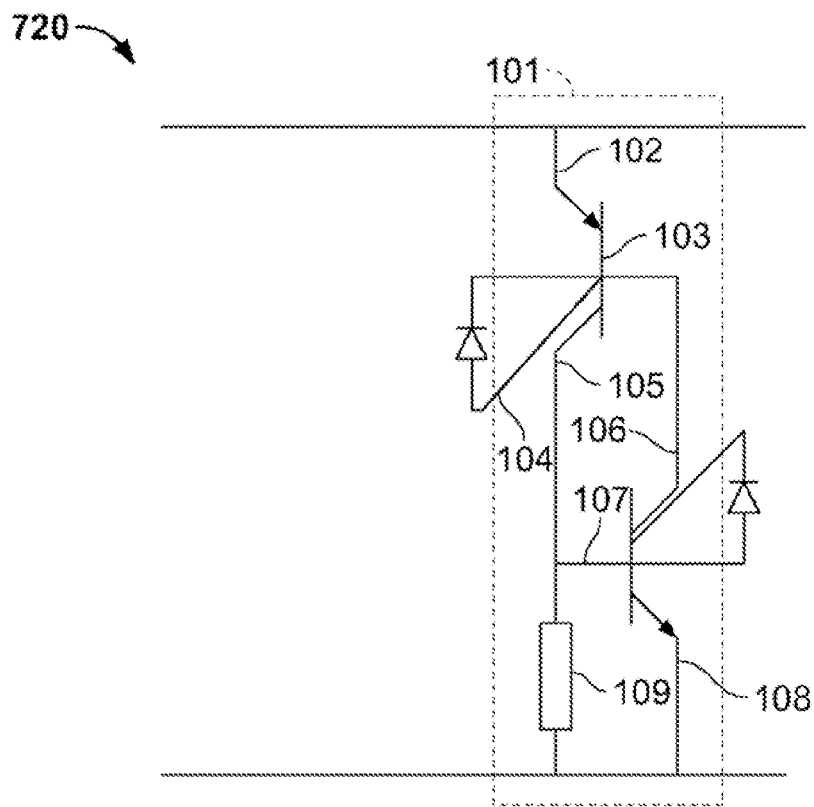
FIG. 7C illustrates the ESD protection device in accordance with even further alternate preferred embodiment of the present invention.

It is noted that the ESD devices 700, 710 and 720 of FIGS. 7A, 7B and 7C respectively shows the diode 702 as an external diode, i.e. placed outside the body of the SCR 101. However, such a diode may alternatively be placed in the body of the SCR 101, for example the P+/Nwell junction diode.

Figure 8:
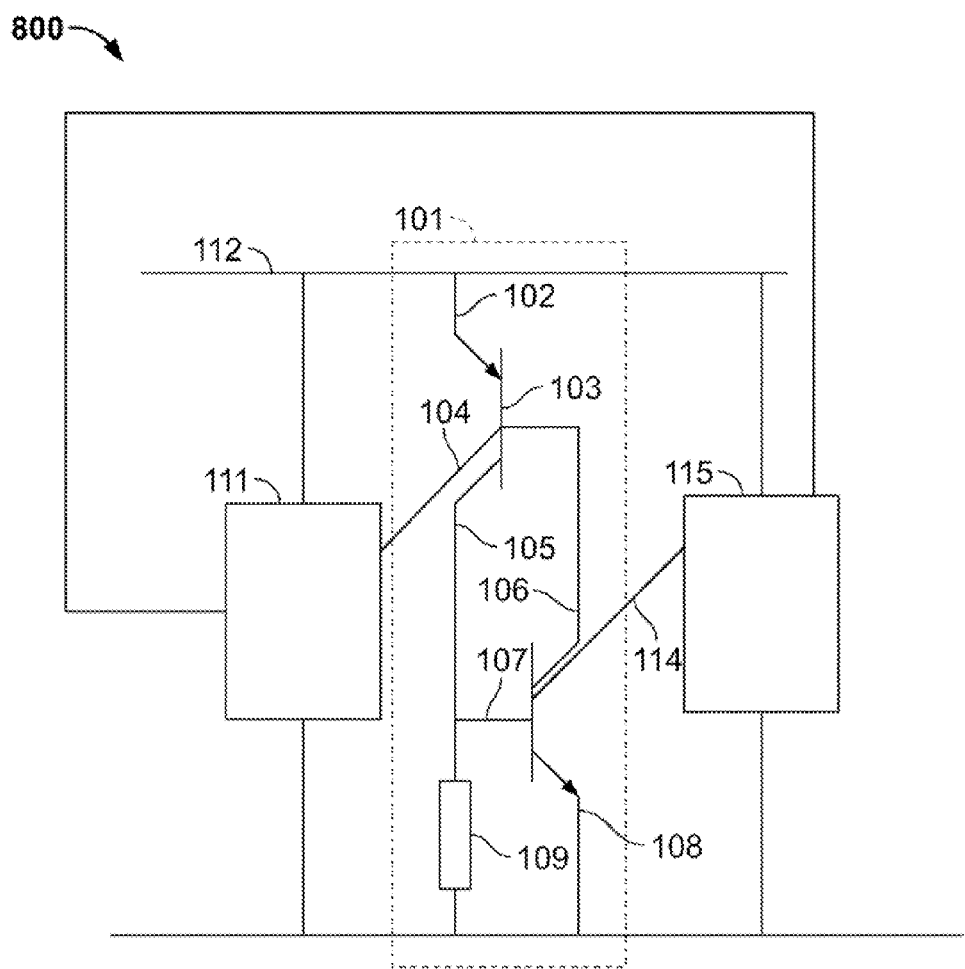
FIG. 8 illustrates the ESD protection device in accordance with further alternate embodiment of the present invention.

Referring to FIG. 8, there is shown an alternate embodiment of the ESD device 800 in accordance with the present invention. The ESD device 800 is similar to the ESD device 300 having both P+ 104 and N+ 114 as additional collectors with their corresponding control circuits 111 and 115 respectively, except there is coupling 802 between control circuits 111 and 115. So this approach, the voltage at the additional collectors 104 and 114 will also determine for a larger part as to how high the holding voltage will be, thus being able to easily adjust the holding voltage of the SCR 101. In this manner, there is a feedback between the two additional collectors 104 and 114 which become self-regulating to be able to control their own voltages. In other words, as the current flowing through the additional collector 104 increases, current at the extra collector 114 also increases resulting in an increase in the change of the voltage at the extra collector 114, and vice versa.

Figure 9A:
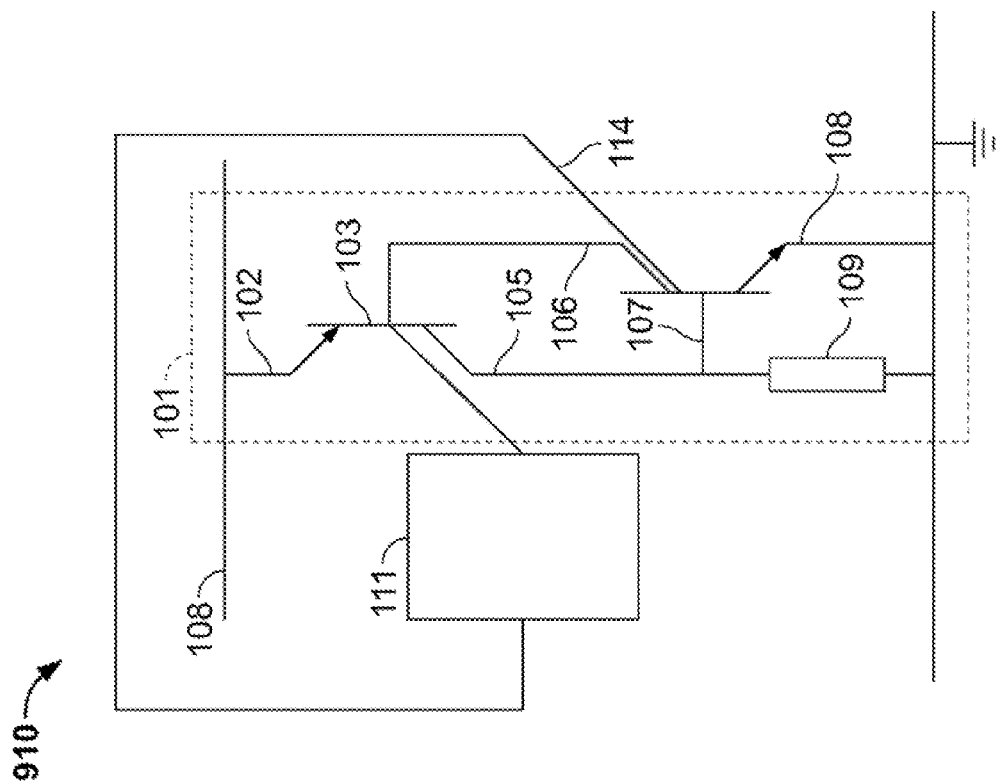
FIG. 9A illustrates the ESD protection device in accordance with a preferred embodiment of the present invention.
Figure 9B:
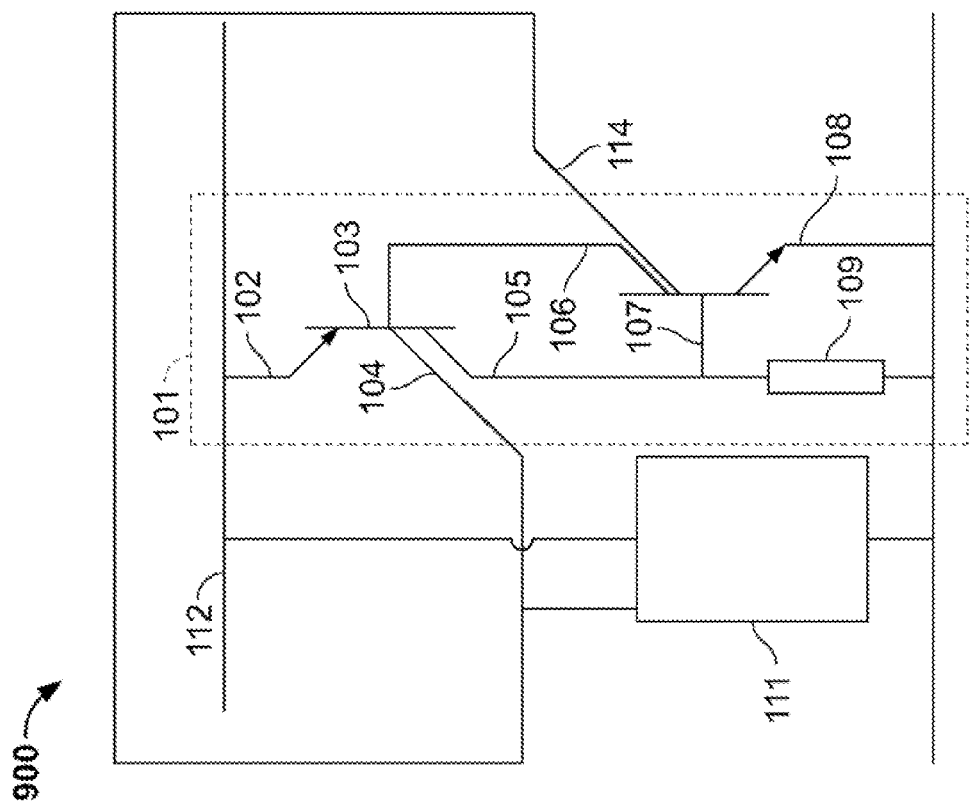
FIG. 9B illustrates the ESD protection device in accordance with an alternate preferred embodiment of the preset invention.

Alternatively, an ESD protection device 900 as shown in FIG. 9A includes only one control circuit 111 controlling both the additional collectors 114 and 115 and further the two additional collectors 114 and 115 are directly coupled to each other without any circuit in between. In even another alternate embodiment, the ESD protection device 910 as shown in FIG. 9B in which the PNP second collector 104 is coupled to the NPN second collector 114 by another element 902 which may include a diode, a resistor, a bipolar transistor, a MOS, and like or combinations of these elements.

Figure 10:
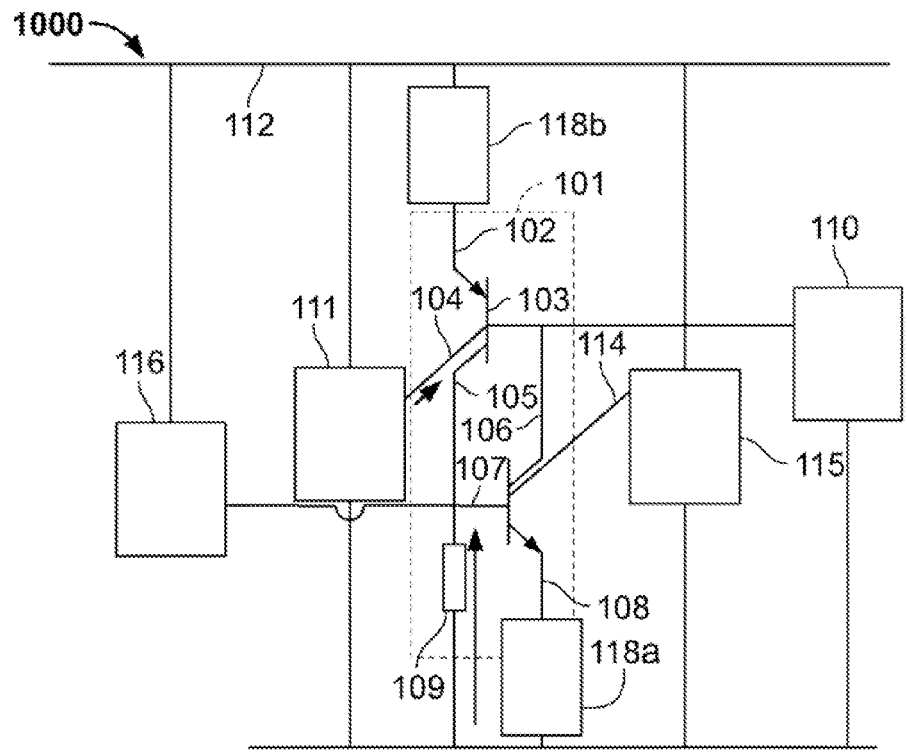
FIG. 10 illustrates the ESD protection device in accordance with another preferred embodiment of the present invention.

Referring to FIG. 10, there is shown an ESD device 1000 with reference to a preferred embodiment of the present invention. In the ESD device 1000 as shown is similar to ESD device 300 except it includes an additional trigger element 116 coupled between the anode 112 and the base of the 107 of npn. The ESD device 1000 also includes the first additional element 118a between the emitter 108 and ground and second additional element 118b between the emitter 102 and the anode 112. By placing the first and the second additional elements 118a and 118b respectively, the trigger current and the trigger voltage (or holding current and holding voltage of the SCR 101) is increased. The SCR 101 can be turned on only if the voltage built up over the element 118a and ground is large enough that the element 118a can conduct current. For example if this element 118a is a diode in forward base position, the minimum voltage built up is the built in voltage of approx. 0.7V. As shown by the arrow, this voltage is built up also over the additional resistor element 109 causing an increase in voltage at the base 107 of the NPN. The voltage at the collector 105 will be pulled to the voltage at the base 107 of the NPN resulting in a larger voltage difference between the collector 105 and the additional collector element 104. This would pull more current to flow into the additional collector 104 which is shunt to ground via the control circuit 111. So, more current will flow thru the additional collector 104 and less current will flow thru the SCR itself (more efficient) since the difference between the two collector voltages is significantly altered. This will increase the holding voltage even more than the previous embodiments.

Note the second additional element 118b in FIG. 10 functions similar to the first additional element 118a (as described above) for the additional collector 114. Even though, two additional elements are shown, it is noted that only one additional element may preferably be used and would provide the same function and result in increase in the holding voltage. Furthermore, elements 116 and 110 describe the two possible positions of the trigger elements as shown. However, it is noted that only one of the elements 116 or 110 may preferably be sufficient to trigger the SCR 101. Alternatively, instead of two additional collectors 104 and 114, only one collector may preferably be placed in the circuit.

Figure 11:
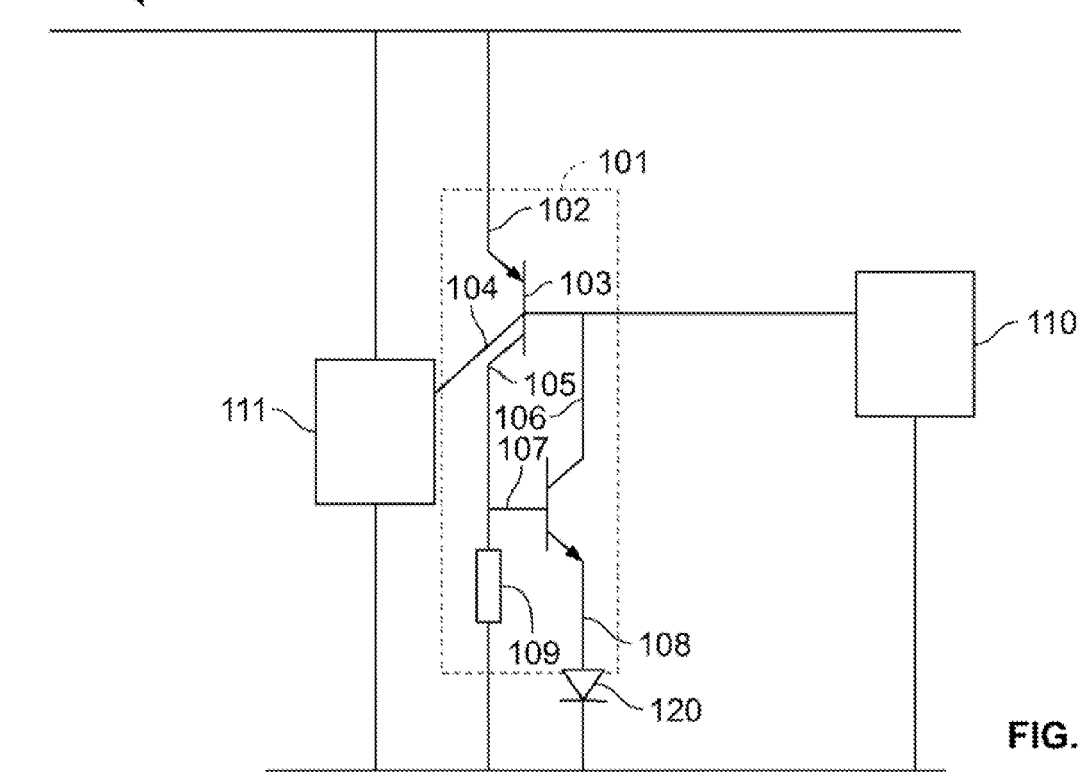
FIG. 11 illustrates the ESD protection device in accordance with further preferred embodiment of the present invention.

FIG. 11 shows the ESI protection device 1100 in which diode 120 is illustrated as the first additional element 118a of the FIG. 10 in accordance with a preferred embodiment of the present invention. Note the ESD device 1100 does not include the second additional element 118b, the trigger element 116 and the control circuit 115. Besides diode, other elements such as a diode, a MOS, GGNMOS, an SCR and like may preferably be used as the additional elements 118a and/or 118b.

Figure 12:
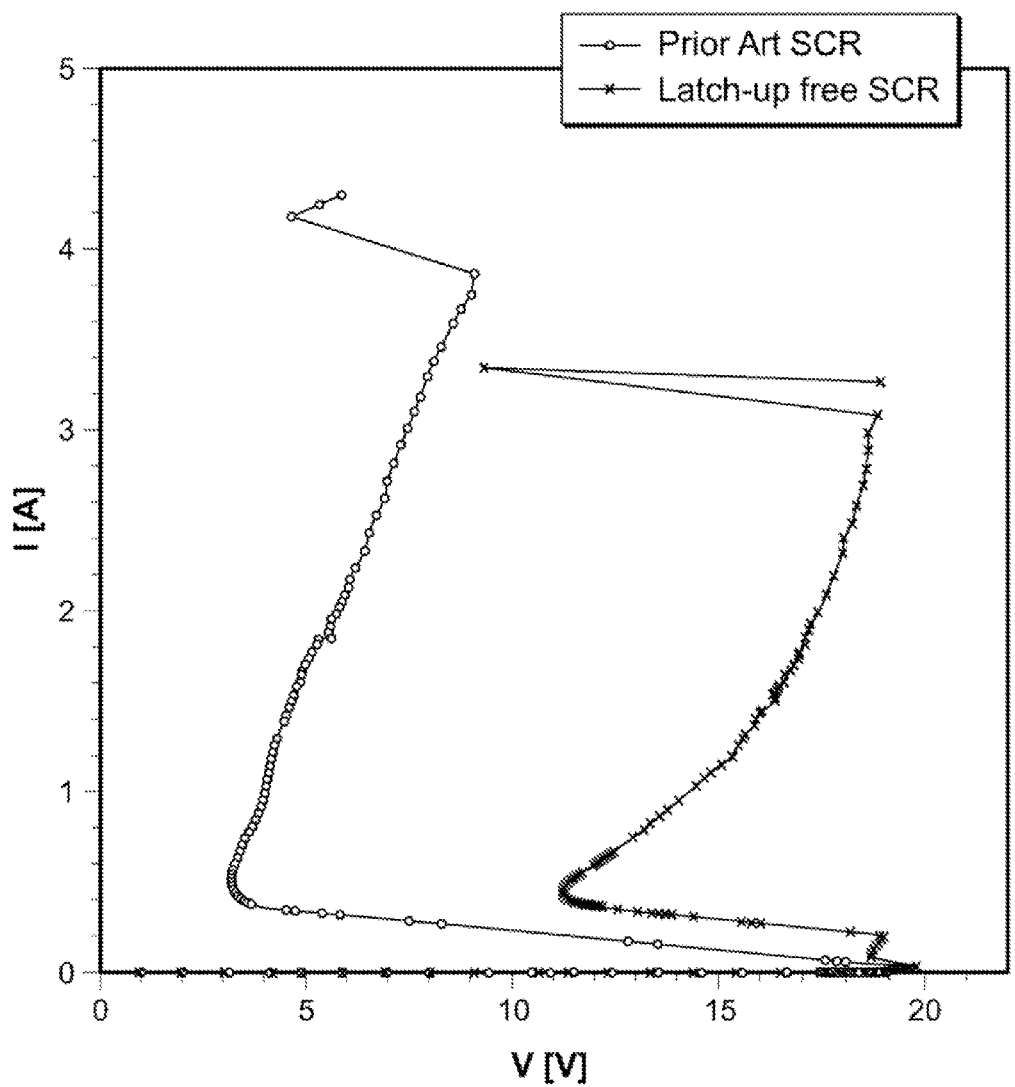
FIG. 12 illustrates a graphical representation of the comparison of the holding voltage of the present invention with the prior art.

Referring to FIG. 12 there is shown a graphical representation of holding voltage (Vdd) vs the current (I) of the present invention in comparison with the prior art. Clearly, the holding voltage of the SCR 101 as described in the embodiments of the present invention is much higher than the holding voltage of the prior art SCR. However, the triggering voltage as to when the SCR 101 begins to conduct current is at the same potential as the prior art SCR.

Figure 13:
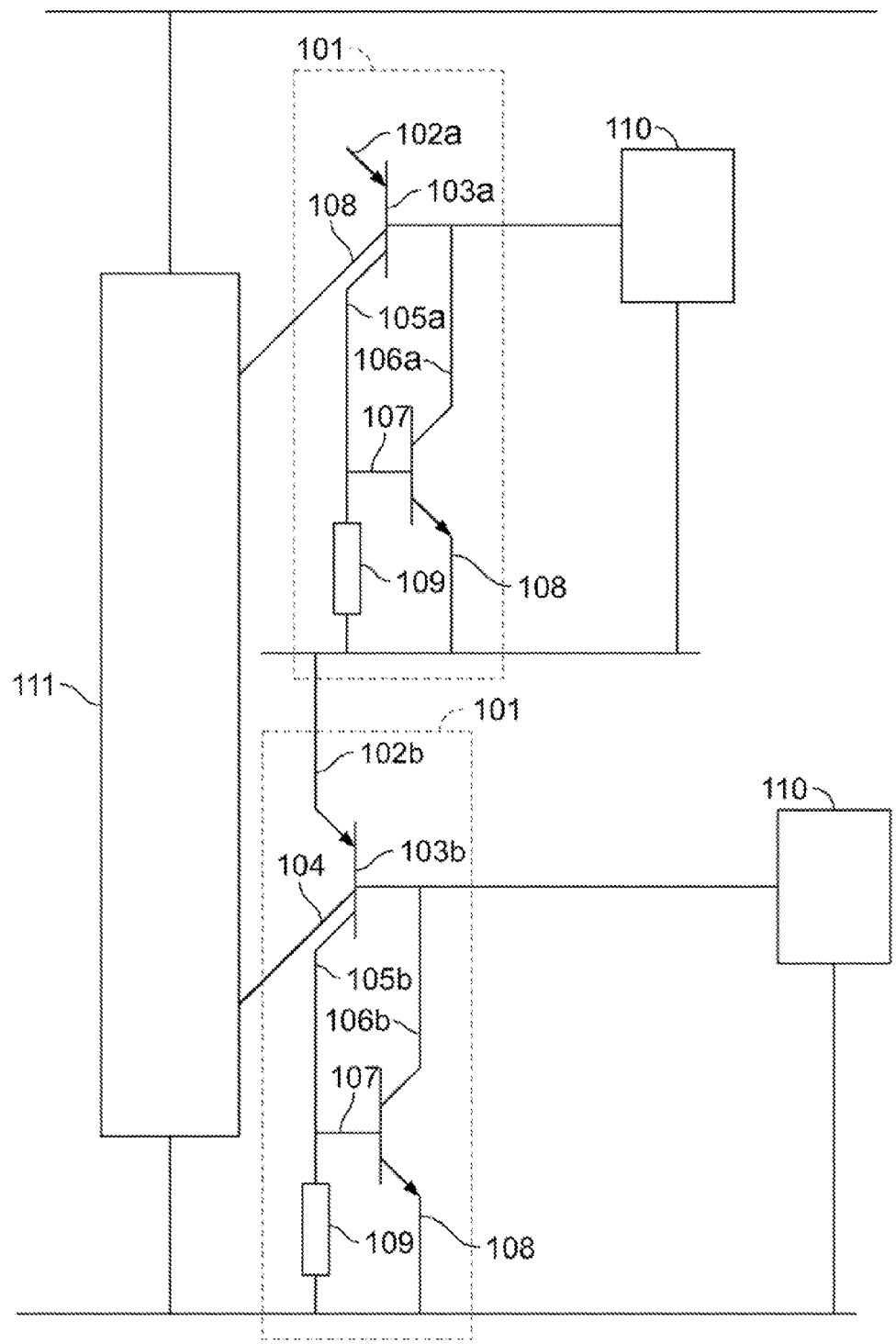
FIG. 13 illustrates the ESD protection device in accordance with even further embodiment of the present invention.

Referring to FIG. 13, there is shown a cascade version of two SCRs 101a and 101b coupled to one controlled circuit 110 while a first SCR 101a is coupled to a first trigger element 110a and a second SCR 101b is coupled to a second trigger element 101b. In this embodiment the second collector 104a of the first SCP 101a is coupled to the control circuit 111 and a third collector 104b of the second SCR 101b is coupled to the control circuit 111.

It is noted that the technique of increasing the holding voltage in the embodiments describe above by coupling an extra collector 104 to the anode and/or the extra collector 114 to the cathode can also be applied to keep or decrease the latch-up susceptibility of unwanted parasitic SCRs.

Although in the embodiments as shown the base emitter 102-103 and 107-108 are shared for the collectors 105 and 106 of the SCR 101 with their second collectors 104 and 114 respectively, the invention is not limited to the explicit sharing. Extra emitter and/or base can be added and coupled through metallization to the base and emitters of the SCR 101.

The present invention is not limited to some technologies. It can be used in many technologies for example in CMOS, High voltage CMOS (HV-CMOS), Bipolar CMOS Drain extended MOS (BCD), Silicon On Insulator (SOI), heterojunction technologies (Eg SiGe) etc.

Although various embodiments that incorporate the teachings of the present invention have been shown and described in detail herein, those skilled in the art can readily devise many other varied embodiments that still incorporate these teachings without departing from the spirit and the scope of the invention.

The invention claimed is:

1. An electrostatic discharge (ESD) protection circuit comprising:
an SCR including at least a PNP transistor and at least a NPN transistor, said PNP transistor is coupled to an anode and the NPN transistor is coupled to a cathode;
said PNP transistor including a PNP first base, a PNP first emitter and a PNP first collector;
said NPN transistor including a NPN first base, a NPN first emitter and a NPN first collector;
said PNP first emitter is coupled to the anode, the first PNP base is coupled to the NPN first collector, the PNP first collector is coupled to the NPN first base and the NPN first emitter is coupled to the cathode;
said at least one of the PNP transistor and the NPN transistor having at least one second collector; and
at least one control circuit coupled between the anode and the cathode, said at least one control circuit coupled to said at least one second collector to control holding voltage of the SCR.

2. The ESD circuit of claim 1 wherein said second collector is formed in a surface area between the PNP first emitter of the PNP transistor and the NPN first emitter of the NPN transistor.

3. The ESD circuit of claim 2 wherein said at least one control circuit comprises at least a first control circuit and a second control circuit, said first control circuit is coupled to the second collector of the PNP and the second control circuit is coupled to the second collector of the NPN.

4. The ESD protection circuit of claim 1 wherein said control circuit comprises at least one of a diode, a resistor, an inverter, a SCR, a MOS, a bipolar transistor and a capacitor.

5. The ESD protection circuit of claim 1 wherein said control circuit comprises a capacitor, a resistor and a MOS.

6. The ESD protection circuit of claim 1 wherein said control circuit comprises a capacitor, a resistor and a MOS, wherein the resistor is coupled between the anode and the gate of the MOS, the capacitor is coupled between the cathode and the gate of the MOS and the MOS is coupled between the second collector and at least one of the anode and the cathode.

7. The ESD circuit of claim 1 wherein said at least one control circuit comprises at least a first control circuit and a second control circuit, said first control circuit is coupled to said second control circuit.

8. The ESD circuit of claim 1
wherein the PNP first base comprises at least a first N-doped region, the PNP first emitter comprise at least a first P-doped region, the PNP first collector comprises at least a first P-doped region such that the first P-doped region of the PNP first emitter is formed in the first N-doped region of the PNP first base;
wherein the NPN first base comprises at least a first P-doped region, the NPN first emitter comprise at least a first N-doped region, the NPN first collector comprises at least a first N-doped region such that the first N-doped region of the NPN first emitter is formed in the first P-doped region of the NPN first base; and
wherein said at least one second collector comprise at least a first doped region.

9. The ESD circuit of claim 8 wherein said first doped region of the at least one second collector is disposed substantially parallel to at least one of said first P-doped region of the PNP first emitter and said first N-doped region of the NPN first emitter.

10. The ESD circuit of claim 8 wherein the at least first doped region of the at least one second collector is interleaved with at least one of the at least one P-doped region of the at least one emitter of the PNP and the at least one N-doped region of the at least one emitter of the NPN.

11. The ESD circuit of claim 8 wherein said second collector comprises at least multiple doped regions, said multiple doped regions are disposed parallel to at least one of the at least one first P-doped region of the PNP first emitter and of the at least one first N-doped region of the NPN first emitter.

12. The ESD circuit of claim 11 wherein a gate is formed between said multiple doped regions of said second collector.

13. The ESD circuit of claim 8 wherein said first doped region of said second collector is disposed surrounding at least one of the at least one first P-doped region of the PNP first emitter and the at least one first N-doped region of the NPN first emitter.

14. The ESD circuit of claim 8 wherein said first doped region of said second collector is disposed surrounding at least one of the at least one first P-doped region of the PNP first base and the at least one first N-doped region of the NPN first base.

15. The ESD circuit of claim 1 further comprising a trigger device coupled to at least one of the PNP first base of the PNP transistor and the NPN first base of the NPN transistor.

16. The ESD protection circuit of claim 15 wherein said trigger circuit comprises at least one of a diode, a resistor, an inverter, a SCR, a MOS, a bipolar transistor, a capacitor and a resistor.

17. The ESD circuit of claim 1 further comprising a first power supply coupled to the control circuit and a diode coupled between the anode and the first power supply.

18. The ESD circuit of claim 1 wherein said control circuit comprises at least one diode coupled between the second collector and at least one of the PNP first base of the PNP transistor and the NPN first base of the NPN transistor.

19. The ESD circuit of claim 1 wherein said anode is coupled to the PNP first emitter and said cathode is coupled to the NPN first emitter and said second collector is coupled to at least one of the first and second voltage potential.

20. The ESD circuit of claim 19 wherein said anode is coupled to the PNP first emitter by at least one of a diode, resistor, MOS, bipolar transistor and a SCR.

21. The ESD circuit of claim 19 wherein said cathode is coupled to the NPN first emitter by at least one of a diode, resistor, MOS, bipolar transistor and a SCR.

22. The ESD circuit of claim 1 wherein said first PNP transistor comprises the second collector and said first NPN transistor further comprises the second collector.

23. The ESD circuit of claim 22 wherein said PNP second collector is coupled directly to the NPN second collector.

24. The ESD circuit of claim 22 wherein said PNP second collector is coupled to the NPN second collector by a control circuit comprising at least one of a diode, a resistor, a bipolar transistor, and a MOS.

* * * * *